(12) United States Patent
Sherman et al.

(10) Patent No.: US 8,613,169 B2
(45) Date of Patent: Dec. 24, 2013

(54) ELECTRICAL ROUTING STRUCTURES FOR BUILDING INTEGRABLE PHOTOVOLTAIC ARRAYS

(75) Inventors: Adam C. Sherman, Newark, CA (US); Jason S. Corneille, San Jose, CA (US); Michael Meyers, San Jose, CA (US)

(73) Assignee: Miasole, Santa Clara, CA (US)

( * ) Notice: Subject to any disclaimer, the term of this patent is extended or adjusted under 35 U.S.C. 154(b) by 49 days.

(21) Appl. No.: 13/345,040

(22) Filed: Jan. 6, 2012

(65) Prior Publication Data

US 2013/0174885 A1 Jul. 11, 2013

(51) Int. Cl.
*E04D 13/18* (2006.01)

(52) U.S. Cl.
USPC .............. 52/173.3; 52/518; 136/244

(58) Field of Classification Search
USPC ......... 52/173.3, 478, 518, 527, 557; 136/244, 136/251, 291; 126/704, 623
See application file for complete search history.

(56) References Cited

U.S. PATENT DOCUMENTS

| | | |
|---|---|---|
| 3,291,636 A | 12/1966 | Reighter et al. |
| 3,325,769 A | 6/1967 | Travis |
| 3,838,234 A | 9/1974 | Peterson |
| 4,754,285 A | 6/1988 | Robitaille |
| 4,847,818 A | 7/1989 | Olsen |
| 5,059,254 A | 10/1991 | Yaba et al. |
| 5,179,733 A | 1/1993 | Matsui |
| 5,218,577 A | 6/1993 | Seager |
| 5,232,518 A | 8/1993 | Nath et al. |
| 5,391,235 A | 2/1995 | Inoue |
| 5,526,006 A | 6/1996 | Akahane et al. |
| 6,201,180 B1 | 3/2001 | Meyer et al. |
| 6,360,497 B1 | 3/2002 | Nakazima et al. |
| 6,456,724 B1 * | 9/2002 | Watanabe ............ 382/100 |
| 6,576,830 B2 * | 6/2003 | Nagao et al. ......... 136/244 |
| 6,649,822 B2 | 11/2003 | Eguchi et al. |
| 6,707,689 B2 | 3/2004 | Momota et al. |

(Continued)

FOREIGN PATENT DOCUMENTS

| | | |
|---|---|---|
| WO | 2009/137347 | 11/2009 |
| WO | 2009/137348 | 11/2009 |

(Continued)

OTHER PUBLICATIONS

U.S. Appl. No. 13/046,453, filed Mar. 11, 2011, entitled "Separable Flexible Photovoltaic Connector" by Adam C. Sherman et al.

(Continued)

*Primary Examiner* — William Gilbert
*Assistant Examiner* — Gisele Ford
(74) *Attorney, Agent, or Firm* — Weaver Austin Villeneuve & Sampson LLP

(57) ABSTRACT

Provided are electrical routing structures for installing on buildings and for interconnecting adjacent rows of building integrable photovoltaic (BIPV) modules at the ends of these rows. The electrical routing structures may be also used for sealing interfaces with other building components, such as asphalt shingles. An electrical routing structure may include a base, top flap, side flap, and one or two connectors. After the structure is installed, the base is aligned with photovoltaic portions of BIPV modules in one row and bridges a gap between photovoltaic portions of BIPV modules in two adjacent rows. The connectors may be used to interconnect BIPV modules positioned at the ends of two adjacent rows.

20 Claims, 13 Drawing Sheets

(56) References Cited

U.S. PATENT DOCUMENTS

| | | | |
|---|---|---|---|
| 6,840,799 B2* | 1/2005 | Yoshikawa et al. | 439/502 |
| 6,967,278 B2* | 11/2005 | Hatsukaiwa et al. | 136/251 |
| 7,138,578 B2* | 11/2006 | Komamine | 136/251 |
| 7,297,867 B2* | 11/2007 | Nomura et al. | 136/251 |
| 7,708,578 B1 | 5/2010 | Lenox | |
| 7,726,301 B2* | 6/2010 | Shin et al. | 126/704 |
| 7,762,832 B2 | 7/2010 | Minnick | |
| 7,789,700 B2 | 9/2010 | Wang et al. | |
| 7,824,191 B1 | 11/2010 | Browder | |
| 7,854,095 B2* | 12/2010 | Banister | 52/173.3 |
| 7,963,802 B2 | 6/2011 | Corneille et al. | |
| 7,987,641 B2* | 8/2011 | Cinnamon | 52/173.3 |
| 8,147,274 B2 | 4/2012 | Mizukami | |
| 8,192,207 B2 | 6/2012 | Iida | |
| 8,286,393 B2* | 10/2012 | Reyal et al. | 52/173.3 |
| 8,333,040 B2* | 12/2012 | Shiao et al. | 52/173.3 |
| 8,414,308 B1 | 4/2013 | Meyers | |
| 2003/0010377 A1 | 1/2003 | Fukuda et al. | |
| 2003/0098059 A1 | 5/2003 | Hanoka | |
| 2003/0184257 A1 | 10/2003 | Nomura et al. | |
| 2004/0154655 A1 | 8/2004 | Tanaka et al. | |
| 2004/0226247 A1 | 11/2004 | Byrd | |
| 2004/0244827 A1 | 12/2004 | Hatsukaiwa et al. | |
| 2005/0000562 A1 | 1/2005 | Kataoka et al. | |
| 2006/0042683 A1 | 3/2006 | Gangemi | |
| 2007/0193618 A1 | 8/2007 | Bressler et al. | |
| 2008/0149170 A1 | 6/2008 | Hanoka | |
| 2008/0196756 A1 | 8/2008 | Basol | |
| 2008/0289272 A1 | 11/2008 | Flaherty et al. | |
| 2008/0302030 A1 | 12/2008 | Stancel et al. | |
| 2009/0084432 A1 | 4/2009 | Kosmehl | |
| 2009/0126782 A1 | 5/2009 | Krause et al. | |
| 2009/0215304 A1 | 8/2009 | Faust et al. | |
| 2010/0050569 A1 | 3/2010 | Dutra | |
| 2010/0078058 A1 | 4/2010 | Nightingale et al. | |
| 2010/0236541 A1 | 9/2010 | Smith et al. | |
| 2010/0313501 A1 | 12/2010 | Gangemi | |
| 2010/0326498 A1 | 12/2010 | Corneille et al. | |
| 2011/0139288 A1 | 6/2011 | Rushlander et al. | |
| 2011/0183540 A1 | 7/2011 | Keenihan et al. | |
| 2011/0277811 A1 | 11/2011 | Corneille et al. | |
| 2013/0098420 A1 | 4/2013 | Sherman et al. | |
| 2013/0118558 A1 | 5/2013 | Sherman | |
| 2013/0133721 A1 | 5/2013 | Balyon | |
| 2013/0146125 A1 | 6/2013 | Meyers | |

FOREIGN PATENT DOCUMENTS

| | | |
|---|---|---|
| WO | 2009/137351 | 11/2009 |
| WO | 2009/137352 | 11/2009 |
| WO | 2009/137353 | 11/2009 |

OTHER PUBLICATIONS

U.S. Appl. No. 13/046,461, filed Mar. 11, 2011, entitled "Electrical Connectors of Building Integrable Photovoltaic Modules" by Jason S. Corneille et al.
U.S. Appl. No. 13/042,320, filed Mar. 7, 2011, entitled "Sliding Electrical Connectors for Building Integrable Photovoltaic Modules" by Michael C. Meyers.
U.S. Appl. No. 13/043,227, filed Mar. 8, 2011, entitled "Flexible Connectors for Building Integrable Photovoltaic Modules" by Adam C. Sherman.
U.S. Appl. No. 13/046,453, Office Action mailed Jan. 9, 2012.
U.S. Appl. No. 13/046,453, Final Office Action mailed May 18, 2012.
U.S. Appl. No. 13/042,320, Office Action mailed Jul. 26, 2012.
U.S. Appl. No. 13/042,317, Notice of Allowance mailed Dec. 7, 2012.
U.S. Appl. No. 13/046,461, Office Action mailed Apr. 9, 2013.
U.S. Appl. No. 13/042,325, filed Mar. 7, 2011, entitled "Photovoltaic Module Pin Electrical Connectors" by Michael C. Meyers.
U.S. Appl. No. 13/042,325, Office Action mailed Mar. 18, 2013.
U.S. Appl. No. 13/043,225, filed Mar. 8, 2011, entitled "Interlocking Edges Having Electrical Connectors For Building Integrable Photovoltaic Modules" by Adam C. Sherman.
U.S. Appl. No. 13/043,225, Office Action mailed Apr. 18, 2013.
U.S. Appl. No. 13/085,268, filed Apr. 12, 2011, entitled "Base Sheet Integrated Photovolatic Roofing Assemblies" by Steven T. Croft, et al.
U.S. Appl. No. 13/085,268, Office Action mailed Oct. 12, 2012.
U.S. Appl. No. 13/085,268, Final Office Action mailed May 24, 2013.
U.S. Appl. No. 13/234,454, filed Sep. 16, 2011, entitled "Building Integrable Interconnection Structures Having Field-Configurable Shapes" by Adam C. Sherman.

* cited by examiner

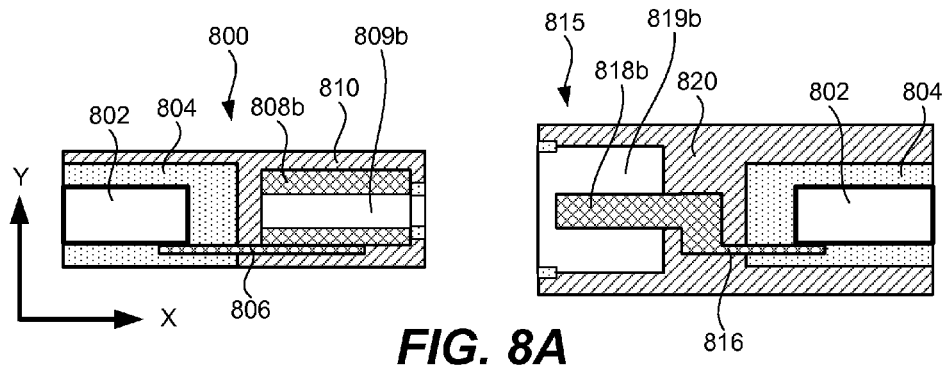
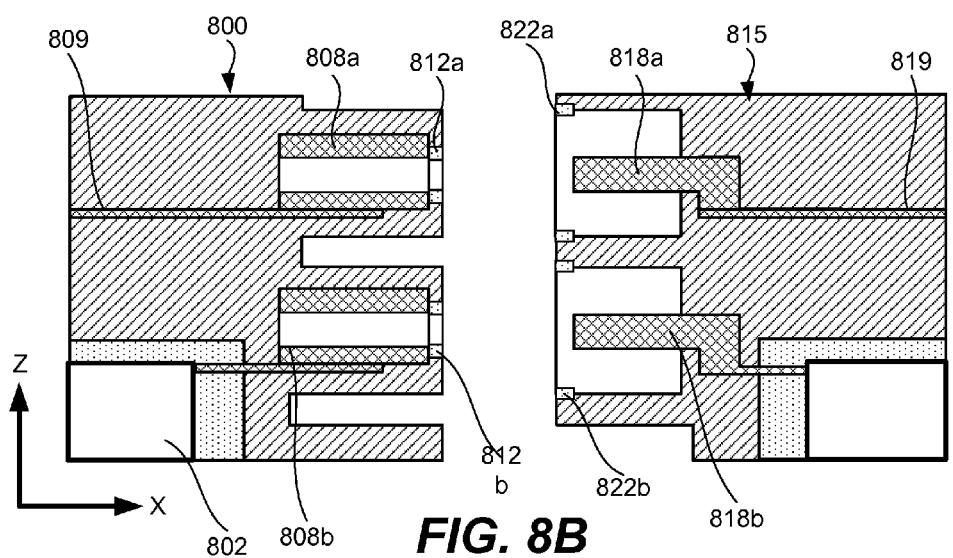
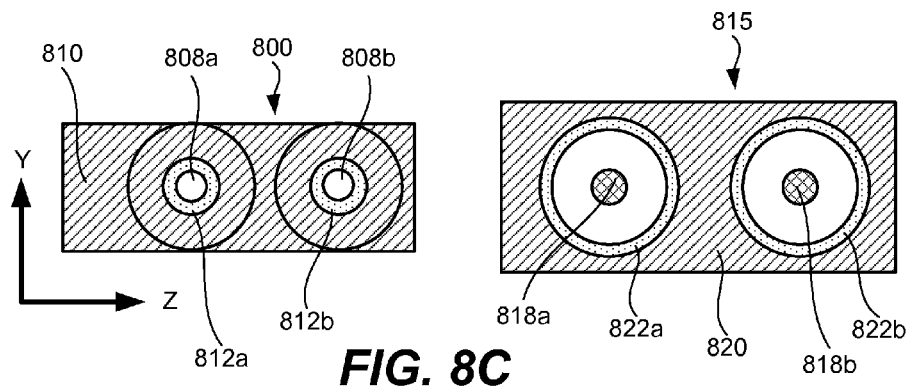
FIG. 8A
FIG. 8B
FIG. 8C

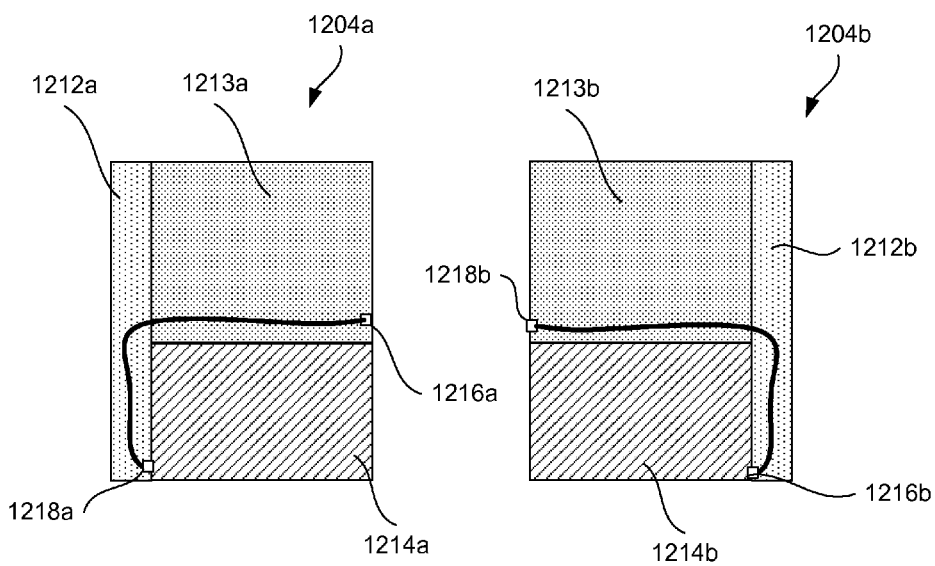
FIG. 12B  FIG. 12C
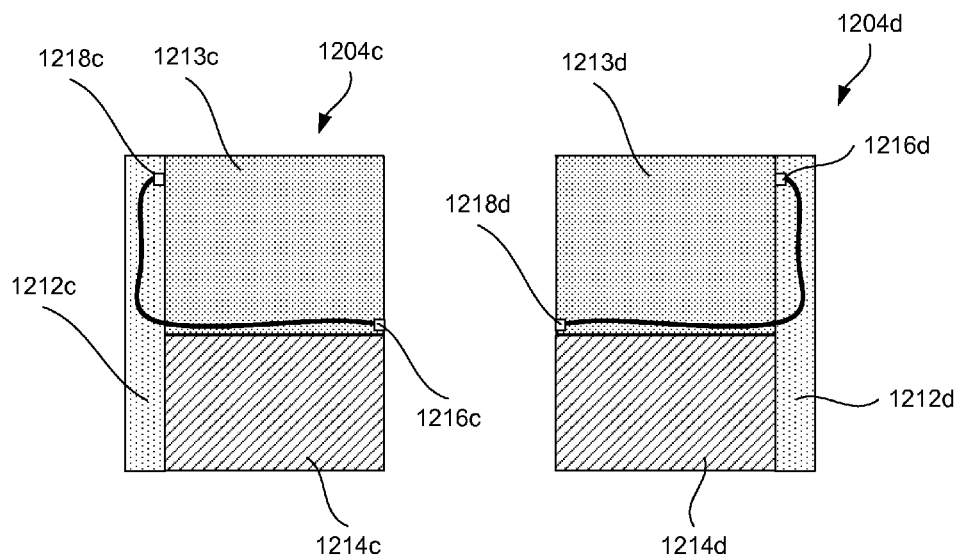
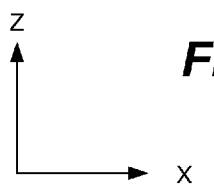
FIG. 12D  FIG. 12E

US 8,613,169 B2

ELECTRICAL ROUTING STRUCTURES FOR BUILDING INTEGRABLE PHOTOVOLTAIC ARRAYS

BACKGROUND

Photovoltaic cells are widely used for electricity generation, with one or more photovoltaic cells typically arranged within a module. Multiple modules may be then arranged into photovoltaic arrays and used to convert solar energy into electricity by the photovoltaic effect. Arrays can be installed on building rooftops and are used to provide electricity to the buildings and to the general electrical grid.

SUMMARY

Provided are novel electrical routing structures for interconnecting and interfacing with building integrable photovoltaic (BIPV) modules. In some embodiments, an electrical routing structure facilitates electrical interconnection of two BIPV modules positioned in adjacent rows. These BIPV modules may be offset with respect to each other. The electrical routing structures may also interface with other building components, such as asphalt shingles, and may be used to seal the interfaces between these building components and BIPV modules. In certain embodiments, electrical routing structures include photovoltaic cells contributing to electrical power generation together with BIPV modules. Electrical routing structures may also include wire channels for feeding wires from other electrical components of the array.

In certain embodiments, an electrical routing structure for installing on a building structure and interconnecting two adjacent rows of building integrable photovoltaic modules is provided. The electrical routing structure may include a base, top flap, side flap, two connectors, and electrical leads. The base includes a top edge and a bottom edge defining the width of the base. The width of the base may be substantially the same as the width of photovoltaic portions of the building integrable photovoltaic modules. The base also includes a first side edge and a second side edge defining the length of the base. The top flap is attached to the base at the top edge of the base such that the length of the top flap substantially coincides with the length of the base. The width of the top flap is substantially the same as the width of the moisture flap portions of the building integrable photovoltaic modules and greater than the width of the base. The top flap is configured to extend at least under a photovoltaic portion of one building integrable photovoltaic module positioned in a row above the two adjacent rows. The side flap is attached to the base at the first side edge and extending along the width of the base as well as along the width of the top flap. The side flap is configured to extend under sealing components of the building structure. The first connector includes at least two conductive elements and positioned along the first side edge. The second connector also includes at least two conductive elements positioned along the second side edge. Each of the two electrical leads connects one conductive element of the first connector with a corresponding conductive element of the second connector.

In certain embodiments, the electrical routing structure includes a wire channel provided in the side flap and extending along the width of the base and the width of the top flap. The wire channel is configured to route wires extending from adjacent electrical routing structures. In the same or other embodiments, the electrical routing structure includes a wire conduit attached to a back side of the side flap and protruding substantially perpendicular to the back side. The base may include one or more photovoltaic cells provided on a light incident side of the base. The photovoltaic cells may be connected in series with one of the electrical leads. The voltage output rating of these photovoltaic cells may be substantially the same as for the building integrable photovoltaic modules. In other embodiments, the size of each photovoltaic cell is substantially the same as the photovoltaic cells in the building integrable photovoltaic modules. A portion of the side flap adjacent to the base may configured to be exposed to the light and includes additional photovoltaic cells. The photovoltaic cells may be sealed between two sealing sheets forming a photovoltaic portion. The photovoltaic portion may be positioned above the base with a gap between the base and photovoltaic portion.

In certain embodiments, a light incident side of the base matches in appearance the front side of the photovoltaic portion of the building integrable photovoltaic modules. A back side of the base may include two or more ribs to form channels for ventilating the back side of the electrical routing structure when installed on the building structure. The top flap may include one or more mechanical fasteners' markers. The top flap may include one or more protrusions for protruding mechanical fasteners during installation of the electrical routing structure on the building structure. The back side of the base may be shifted upward with respect to the back side of the side flap for accommodating a moisture flap portion of a building integrable photovoltaic module connected to the first connector.

In certain embodiments, the first connector is flexibly attached to the base. The first connector is movable with respect to the second connector. The conductive elements of the first connector may have cylindrical shapes substantially parallel to a back side of the base. In other embodiments, the conductive elements of the first connector have cylindrical shapes substantially perpendicular to a back side of the base. The first connector may be positioned within boundaries of the base. The second connector may be positioned within boundaries of the top flap.

These and other embodiments are described further below with reference to the figures.

BRIEF DESCRIPTION OF THE DRAWINGS

FIGS. 8A-8C are schematic cross-sectional views of two connectors configured for interconnection with each other, in accordance with certain embodiments.

FIG. 12B is a schematic representation of a left up-and-in electrical routing structure, in accordance with certain embodiments.

FIG. 12C is a schematic representation of a right up-and-in electrical routing structure, in accordance with certain embodiments.

FIG. 12D is a schematic representation of a left up-and-out structure, in accordance with certain embodiments.

FIG. 12E is a schematic representation of a right up-and-out structure, in accordance with certain embodiments.

DETAILED DESCRIPTION OF EXAMPLE EMBODIMENTS

Figure 1:
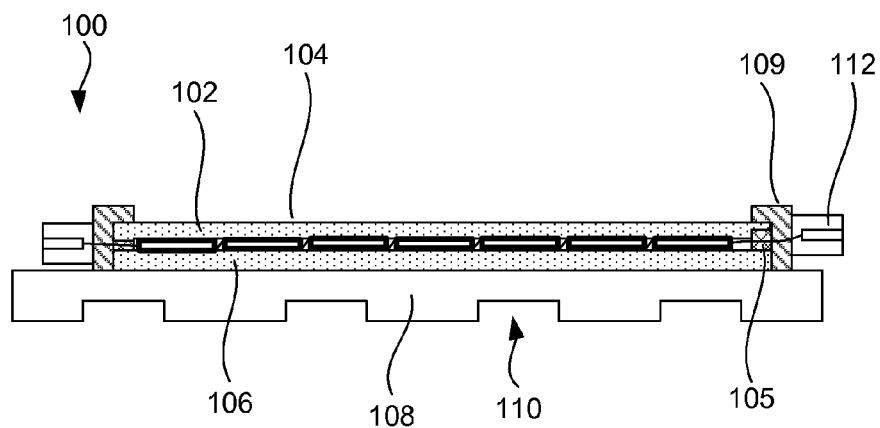
FIG. 1 is a schematic cross-sectional side view of a BIPV module, in accordance with certain embodiments.

BIPV modules installed on building structures provide electrical power and protect the underlying building structures from the environment. BIPV modules can be interconnected in strings. According to various embodiments described herein, such strings may extend across multiple adjacent rows of BIPV modules. In certain embodiments, two adjacent rows are interconnected using BIPV modules positioned at the ends of these rows. These end modules may be offset with respect to each other in the direction extending along the row, such that a row may extend beyond an adjacent row. The offset can facilitate sealing BIPV modules and improve the aesthetic appearance of the array.

In some embodiments, electrical routing structures for installing on buildings and forming electrical connections between adjacent rows of BIPV modules are provided. The electrical routing structures can be configured to accommodate an offset between the adjacent rows and to make electrical connections on one or more ends of the rows. Different types of electrical routing structures may be used for situations when a top row extends past the adjacent bottom row and for situation when a bottom row extends past the top row. Each side of a photovoltaic string may have one or more electrical routing structures interconnecting pairs of adjacent rows. While the below discussion describes interconnecting BIPV modules in adjacent rows, electrical routing structures for forming electrical connections between non-adjacent rows of BIPV modules are also within the scope of the invention.

An electrical routing structure may include a base, a top flap, a side flap, and one or two connectors. In certain embodiments, an electrical routing structure includes one or more other features, such as a wire channel for routing wires alongside the string. In the same or other embodiments, an electrical routing structure may include one or more photovoltaic cells provided on a light incident side of the base. During array installation, the base of an electrical routing structure can be aligned with a photovoltaic portion of a BIPV module. The width of the base may be substantially the same as the width of the photovoltaic portions of BIPV modules in the array. The length of the base may correspond to an offset between BIPV modules in two adjacent rows such that when the electrical routing structure is installed, the ends of these rows are substantially aligned. This alignment may help sealing the interface with other building components, such as asphalt shingles.

The top flap of an electrical routing structure can extend under a top row of BIPV modules and may be used to seal interfaces between modules in this row and between adjacent rows. Electrical routing structures can also include side flaps that extend along the length of the row. During installation, asphalt shingles or other building components can be positioned over the side flap of an electrical routing structure to seal the interface between the electrical routing structure and these components.

One or more connectors of an electrical routing structure can be configured to make electrical connections to BIPV modules positioned at the ends of two adjacent rows or, more specifically, to module connectors of these modules. Each connector may have one or more conductive elements interconnected, or configured to interconnect, with corresponding conductive elements of another connector. Positions of the connectors with respect to the base of an electrical routing structure can be varied based on positions of module connectors of BIPV modules. For example, one connector may be positioned in the top flap area of an electrical routing structure. Another connector may be positioned within the bottom area of the base. In certain embodiments, an electrical routing structure includes only one connector. In such embodiments, the single connector can be used for interconnecting conductive elements of the module connector (e.g., jumping the end module in the string) or may be used for connecting conductive elements of the module connector to an inverter. Electrical routing structures having only a single connector may be referred to as specially configured electrical routing structures.

To provide a better understanding of various features of electrical routing structures and corresponding BIPV modules and methods of integrating these structures and modules in the same string and/or array, examples of BIPV modules are described below with reference to FIGS. 1-8. FIG. 1 is a schematic cross-sectional end view (line 1-1 in FIG. 2 indicates the position of this cross-section) of a BIPV module 100, in accordance with certain embodiments. BIPV module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi-junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also in the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (for example, between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front sheet 104 (i.e., the light incident sheet) and a back sheet 106 (i.e., the building structure facing sheet), which may be referred to as sealing sheets. Examples of such sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about mils and 50 mils. In certain embodiments, a back sheet includes a metallized layer to improve water permeability characteristics of the sheet. For example, a metal foil may be positioned in between two insulating layers to form a composite back sheet. In certain embodiments, a module has an encapsulant layer positioned between one or both sheets 104, 106 and photovoltaic cells 102. Examples of encapsulant layer materials include non-olefin thermoplastic polymers or thermal polymer olefin (TPO), such as polyethylene (e.g., a linear low density polyethylene), polypropylene, polybutylene, polyethylene terephthalate (PET), polybutylene terephthalate (PBT), polystyrene, polycarbonates, fluoropolymers, acrylics, ionomers, silicones, and combinations thereof.

BIPV module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR) (e.g., typically less than 1-2 g/m2/day). In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIPV module 100 is made from a thermally resistant polymeric material. Various examples of thermally resistant materials and RTI ratings are further described below.

BIPV module 100 may also have a support sheet 108 attached to back sheet 106. The attachment may be provided by a support edge 109, which, in certain embodiments, is a part of support sheet 108. Support sheets may be made, for example, from rigid polymer materials such as polyethylene terephthalate (e.g., RYNITE® available from Du Pont in Wilmington, Del.), polybutylene terephthalate (e.g., Crastin® also available from Du Pont), polyphenylene sulfide (e.g., Ryton® available from Chevron Phillips in The Woodlands, Tex.), polyamide (e.g., Zytel® available from DuPont), polycarbonate, and polypropylene. In other embodiments, support sheet 108 may be attached to back sheet 106 without a separate support edge 109 or other separate supporting element. For example, support sheet 108 and back sheet 106 may be laminated together, or support sheet 108 may be formed (e.g., by injection molding) over back sheet 106. In other embodiments, back sheet 106 serves as a support sheet 108. In this case, the same element used to seal photovoltaic cells 102 may be positioned over and contact a roof structure (not shown). Support sheet 108 may have one or more ventilation channels 110 to allow for air to flow between BIPV module 100 and a building surface (e.g., a roof-deck or a water resistant underlayment/membrane on top of the roof deck). Ventilation channels 110 may be used for cooling BIPV module 100 during its operation. For example, it has been found that each 1° C. of heating from an optimal operating temperature of a typical Copper indium gallium (di) selenide CIGS cell causes an efficiency loss of about 0.33% to 0.5%.

Figure 2:
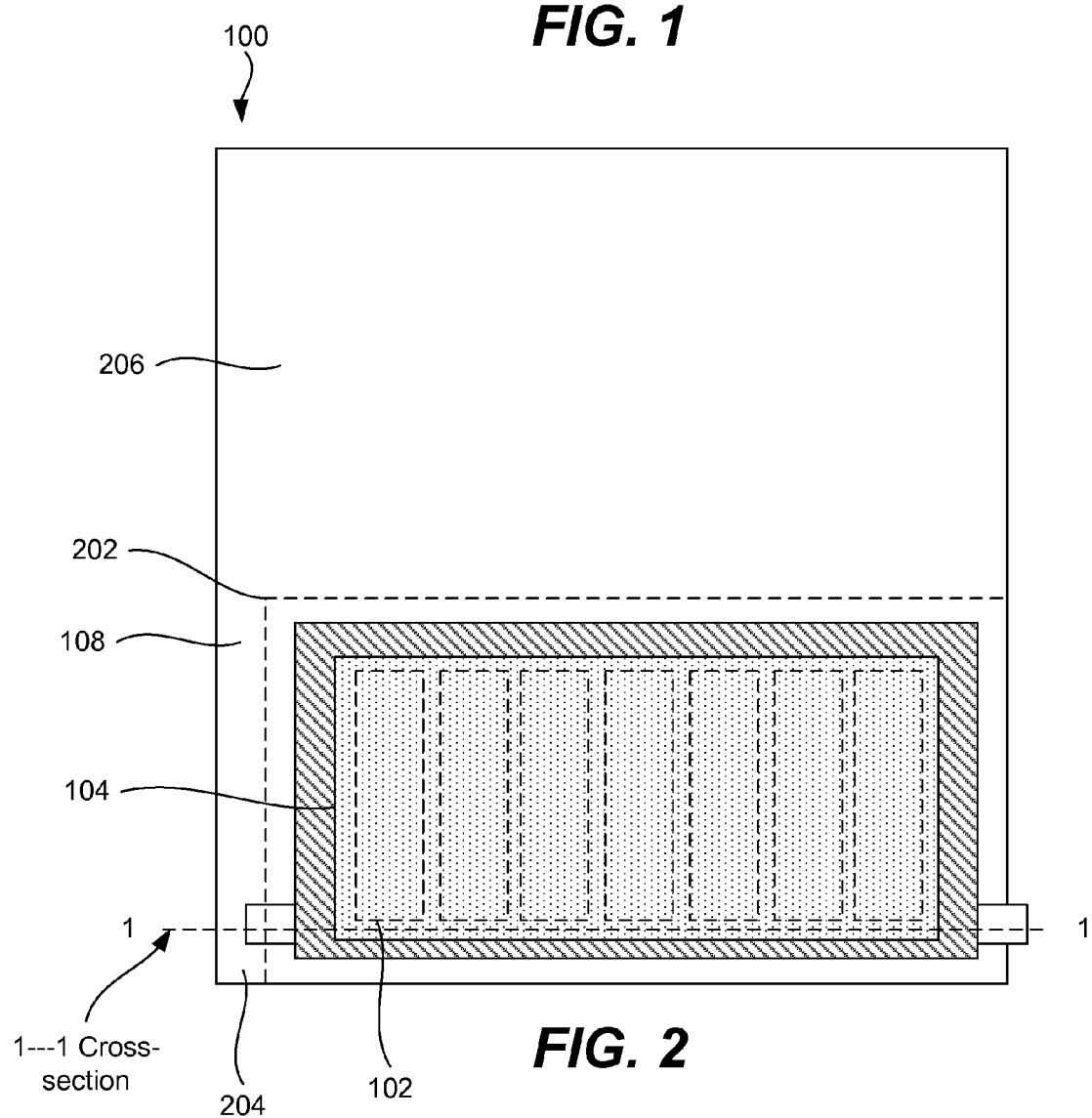
FIG. 2 is a schematic top view of a BIPV module, in accordance with certain embodiments.

BIPV module 100 has one or more electrical connectors 112 for electrically connecting BIPV module 100 to other BIPV modules and array components, such as an inverter and/or a battery pack. In certain embodiments, BIPV module 100 has two electrical connectors 112 positioned on opposite sides (e.g., the short or minor sides of a rectangular module) of BIPV module 100, as shown in FIGS. 1 and 2, for example. However, connectors may also be positioned on other sides as well (e.g., the long or major sides of a rectangular module). Connector position may depend on the overall arrangement of the module and/or installation and repair requirements. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two electrical connectors 112 may have two conductive elements, one of which is electrically connected to photovoltaic cells 102, while the other is electrically connected to a bus bar (not shown) passing through BIPV module 100. This and other examples are described in more detail in the context of FIGS. 6 and 7. In general, regardless of the number of connectors 112 attached to BIPV module 100, at least two conductive elements of these connectors 112 are electrically connected to photovoltaic cells 102.

FIG. 2 is a schematic top view of BIPV module 100, in accordance with certain embodiments. Support sheet 108 is shown to have a side skirt 204 and a flap portion 206 extending beyond a photovoltaic portion 202 of BIPV module 100. Side skirt 204 is sometimes referred to as a side flap, while flap portion 206 is sometimes referred to as a top lap or a moisture flap. In certain embodiments, BIPV module 100 does not include side skirt 204. Photovoltaic portion 202 is defined as an area of BIPV module 100 that does not extend under other BIPV modules or similar building materials (e.g., roofing shingles) after installation. Photovoltaic portion 202 includes photovoltaic cells 102. Generally, it is desirable to maximize the ratio of the exposed area of photovoltaic cells 102 to photovoltaic portion 202 in order to maximize the "working area" of BIPV module 100. It should be noted that, after installation, flaps of other BIPV modules typically extend under photovoltaic portion 202. In a similar manner, after installation, side skirt 204 of BIPV module 100 may extend underneath another BIPV module positioned on the left (in the same row) of BIPV module 100, thereby creating an overlap for moisture sealing. Flap portion 206 may extend underneath one or more BIPV modules positioned above BIPV module 100. Arrangements of BIPV modules in an array will now be described in more detail with reference to FIGS. 3 and 4.

Figure 3:
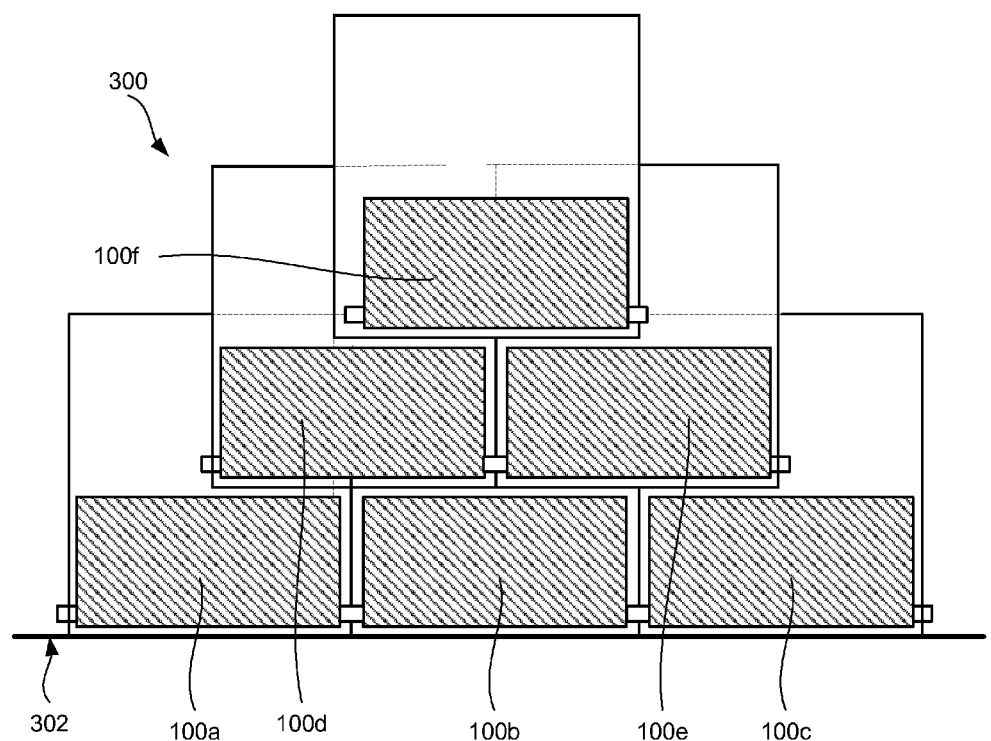
FIG. 3 illustrates a subset of a photovoltaic array that includes six BIPV modules, in accordance with certain embodiments.

FIG. 3 illustrates a photovoltaic array 300 or, more specifically, a portion of a photovoltaic array, which includes six BIPV modules 100a-100f arranged in three different rows extending along horizontal rooflines, in accordance with certain embodiments. Installation of BIPV modules 100a-100f generally starts from a bottom roofline 302 so that the top flaps of BIPV modules 100a-100f can be overlapped with another row of BIPV modules. If a side flap is used, then the position of the side flap (i.e., a left flap or a right flap) determines which bottom corner should be the starting corner for the installation of the array. For example, if a BIPV module has a top flap and a right-side flap, then installation may start from the bottom left corner of the roof or of the photovoltaic array. Another BIPV module installed later in the same row and on the right of the initial BIPV module will overlap the side flap of the initial BIPV module. Furthermore, one or more BIPV modules installed in a row above will overlap the top flap of the initial BIPV module. This overlap of a BIPV module with a flap of another BIPV module creates a moisture barrier.

Figure 4:
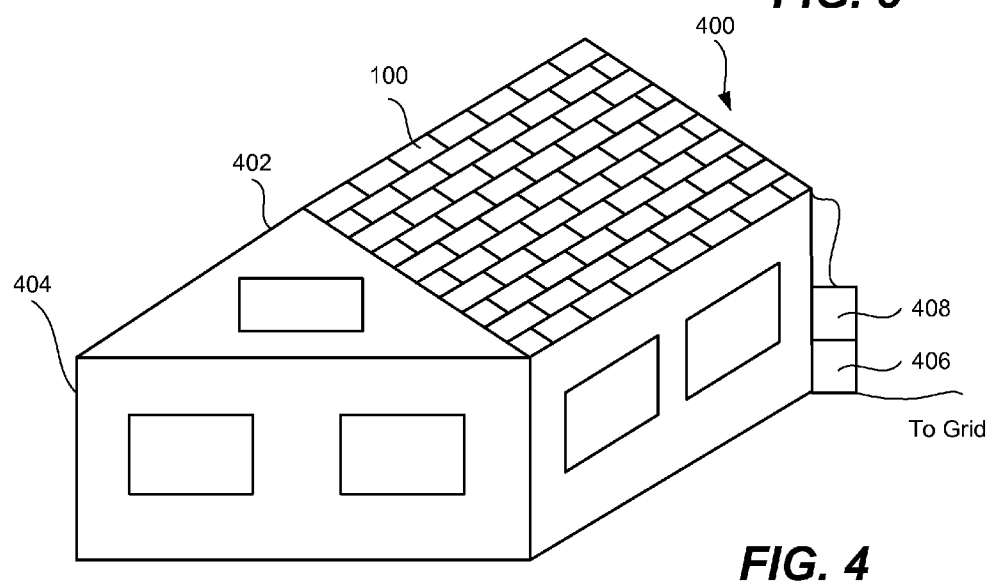
FIG. 4 is a schematic illustration of a photovoltaic array installed on a rooftop of a building structure, in accordance with certain embodiments.

FIG. 4 is a schematic illustration of a photovoltaic array 400 installed on a rooftop 402 of a building structure 404 for protecting building structure 404 from the environment as well as producing electricity, in accordance with certain embodiments. Multiple BIPV modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIPV modules 100 may be used in combination with other roofing materials (e.g., asphalt shingles) and cover only a portion of rooftop. Generally, BIPV modules 100 may be used on steep sloped to low slope rooftops. For example, the rooftops may have a slope of at least about 2.5-to-12 or, in many embodiments, at least about 3-to-12.

Multiple BIPV modules 100 may be interconnected in series and/or in parallel with each other. For example, photovoltaic array 400 may have sets of BIPV modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by BIPV modules 100 into an alternating current (AC). Inverter 406 may be also configured to adjust a voltage provided by BIPV modules 100 or sets of BIPV modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240—Gridtec 10, available from Trace Technologies in Livermore, Calif.) and a string inverter (e.g. Sunny Boy® 2500 available from SMA America in Grass Valley, Calif.). In certain embodiments, BIPV modules 100 may include integrated inverters (i.e., "on module" inverters). These inverters may be used in addition to or instead of external inverters. Battery pack 408 is used to balance electric power output and consumption.

Figure 5:
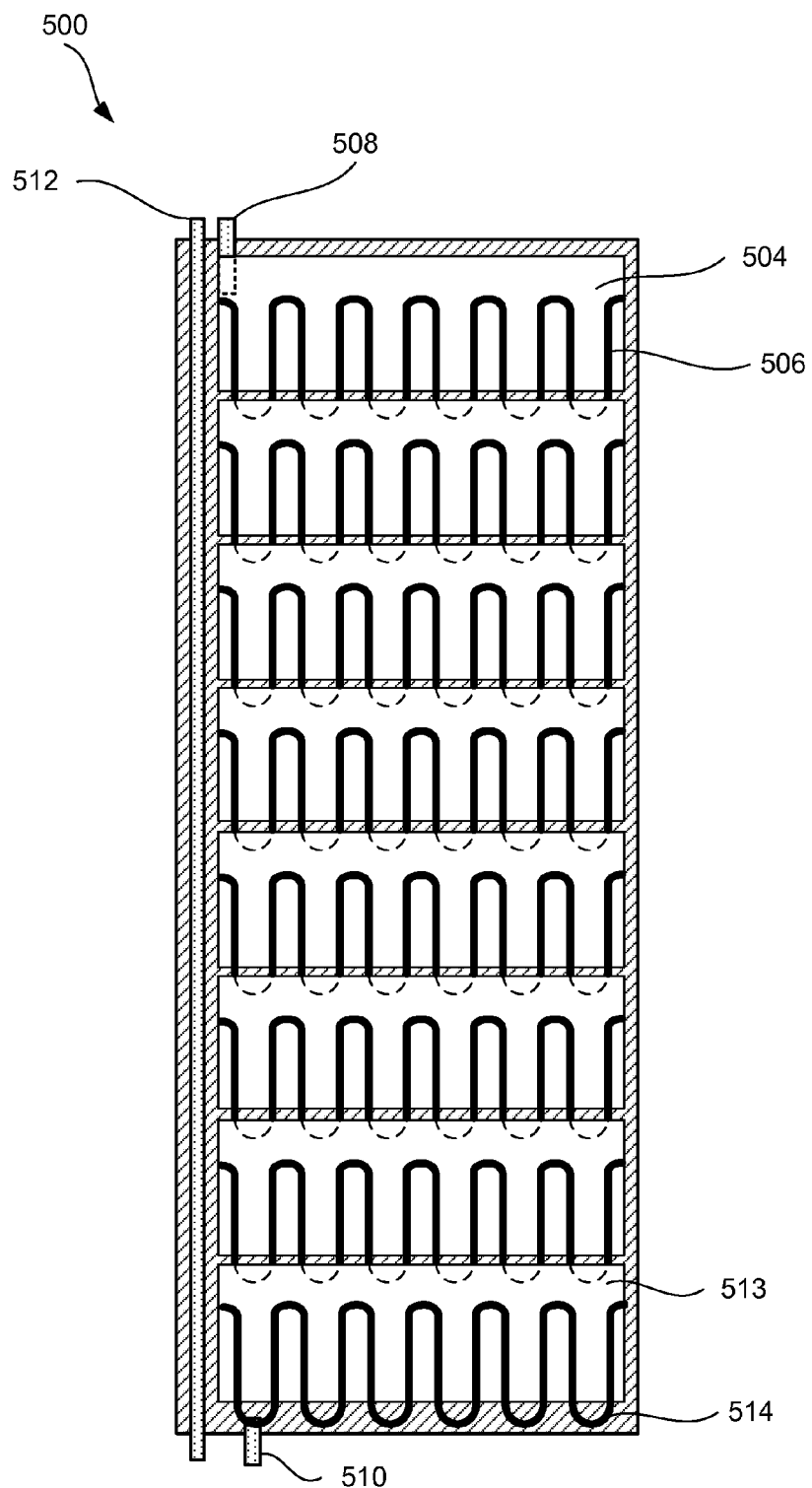
FIG. 5 is a schematic representation of a photovoltaic module having electrically interconnected photovoltaic cells, in accordance with certain embodiments.

FIG. 5 is a schematic representation of photovoltaic module insert 500 illustrating photovoltaic cells 504 electrically interconnected in series using interconnecting wires 506, in accordance with certain embodiments. Often individual cells 504 do not provide an adequate output voltage. For example, a typical voltage output of an individual CIGS cell is only between 0.4V and 0.7V. To increase voltage output, photovoltaic cells 504 may be electrically interconnected in series (for example, as shown in FIG. 5) and/or include "on module" inverters (not shown). Interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used for current collection and cell-to-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts, as further described below with reference to FIG. 6. Similar current collectors/interconnecting wires may be used to interconnect individual cells or set of cells in parallel (not shown).

Figure 6:
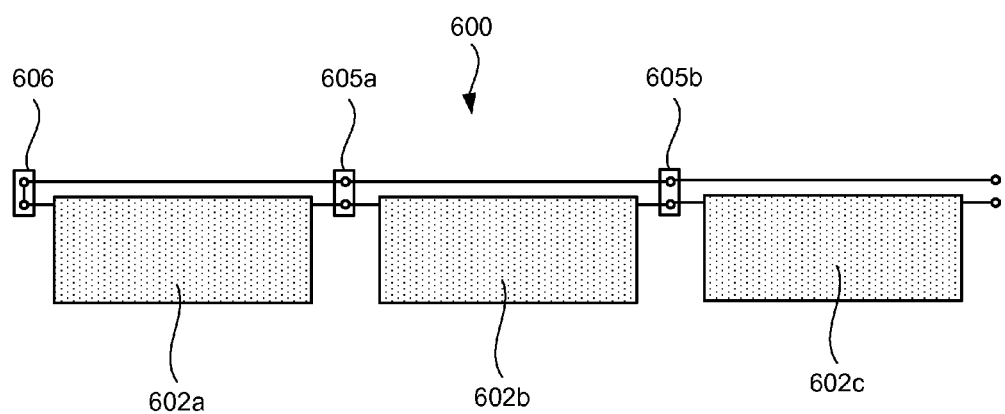
FIG. 6 is a schematic electrical diagram of a photovoltaic array having three BIPV modules interconnected in series, in accordance with certain embodiments.

BIPV modules themselves may be interconnected in series to increase a voltage of a subset of modules or even an entire array. FIG. 6 illustrates a schematic electrical diagram of a photovoltaic array 600 having three BIPV modules 602a-602c interconnected in series using module connectors 605a, 605b, and 606, in accordance with certain embodiments. A voltage output of this three-module array 600 is a sum of the voltage outputs of the three modules 602a-602c. Each module connector 605a and 605b shown in FIG. 6 may be a combination of two module connectors of BIPV modules 602a-602c. These embodiments are further described with reference to FIGS. 8A-8C. In other words, there may be no separate components electrically interconnecting two adjacent BIPV modules, with the connection instead established by engaging two connectors installed on the two respective modules. In other embodiments, separate connector components (i.e., not integrated into or installed on BIPV modules) may be used for connecting module connectors of two adjacent modules.

Module connector 606 may be a special separate connector component that is connected to one module only. It may be used to electrically interconnect two or more conductive elements of the same module connector (e.g., to close an electrical loop in a series of connections).

Figure 7:
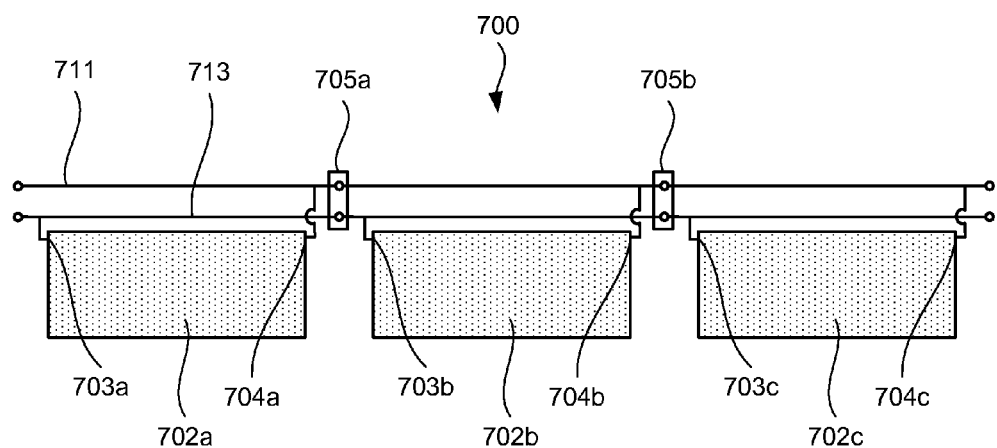
FIG. 7 is a schematic electrical diagram of a photovoltaic array having three BIPV modules interconnected in parallel, in accordance with other embodiments.

Sometimes BIPV modules may need to be electrically interconnected in parallel. FIG. 7 illustrates a schematic electrical diagram of a photovoltaic array 700 having three BIPV modules 702a-702c interconnected in parallel using module connectors 705a and 705b, in accordance with certain embodiments. Each module may have two bus bars extending through the module (i.e., a "top" bus bar 711 and a "bottom" bus bar 713, as shown in FIG. 7). Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIPV modules 702a-702c.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIPV module have a "touch free" design, which means that an installer cannot accidently touch conductive elements or any other electrical elements of these connectors during handling of the BIPV module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each of the connectors 800 and 815 is shown with two conductive elements, i.e., conductive elements 808a and 808b formed as sockets in connector 800 and conductive elements 818a and 818b formed as pins in connector 815. One conductive element of each connector is shown to be electrically connected to photovoltaic cells 802. Another conductive element of each of the two connectors 800 and 815 may be connected to bus bars (e.g., bus bars 809 and 819) that do not have an immediate electrical connection to photovoltaic cells 802 of their respective BIPV module (the extended electrical connection may exist by virtue of a complete electrical circuit).

As shown, conductive elements 808a and 808b may have their own designated inner seals 812a and 812b. Inner seals 812a and 812b are designed to provide more immediate protection to conductive elements 808a and 818a after connecting the two connectors 800, 815. As such, inner seals 812a and 812b are positioned near inner cavities of conductive elements 808a and 808b. The profile and dimensions of pins 818a and 818b closely correspond to that of inner seals 812a and 812b. In the same or other embodiments, connectors 800, 815 have external seals 822a and 822b. External seals 822a and 822b may be used in addition to or instead of inner seals 812a and 812b. FIG. 8C is schematic front view of female connector 800 and male connector 815, in accordance with certain embodiments. Connector pins 818a and 818b are shown to have round profiles. However, other profiles (e.g., square, rectangular) may also be used for pins 818a and 818b and conductive elements 808a and 808b.

Figure 9:
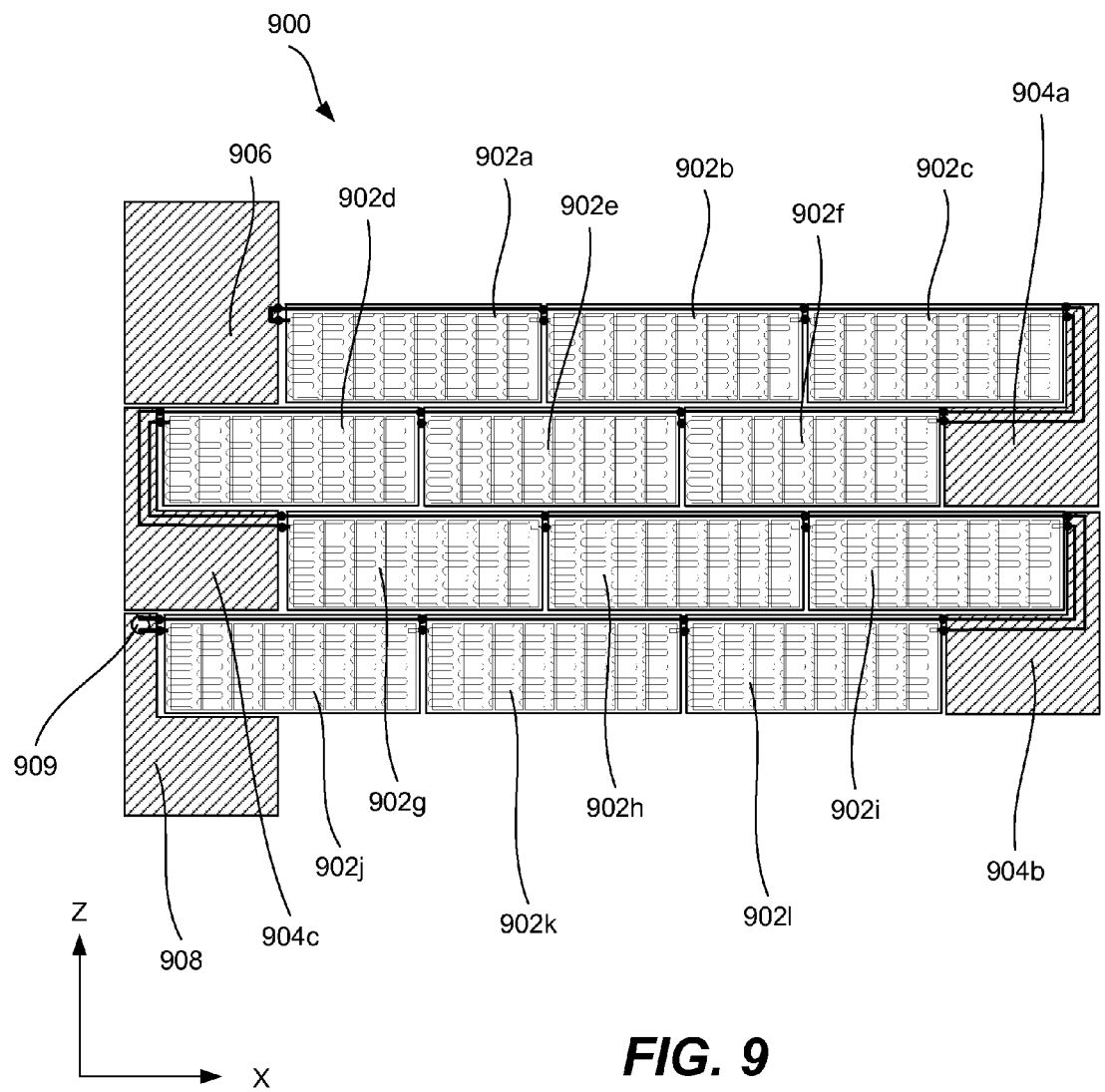
FIG. 9 is a schematic representation of a photovoltaic string including twelve BIPV modules positioned in four different rows and interconnected with multiple electrical routing structures, in accordance with certain embodiments.

Various functions and features of electrical routing structures may be understood from a brief description of a photovoltaic string in which multiple rows of BIPV modules are interconnected using such structures. FIG. 9 is a schematic representation of a photovoltaic string 900 including twelve BIPV modules 902a-902l positioned in four different rows, in accordance with certain embodiments. Every module in this string includes two connectors, i.e., a left connector and a right connector in accordance with the X direction and the layout presented in FIG. 9. Each connector includes two conductive elements. One of these elements is connected to photovoltaic cells of the associated module, while another is connected to a bus bar extending between the left and right connectors of the module. As such, each module has two separate electrical paths. One path extends through the interconnected photovoltaic cells of the BIPV module and is represented by one pair of conductive elements, while another other path goes through a bus bar and is represented by another pair of conductive elements. The latter path is sometimes referred to as a return path.

BIPV modules of a string or, more specifically, their paths can be interconnected to provide various connection schemes within the string. In one example, presented in FIG. 9, string 900 has all BIPV modules 902a-902l interconnected in series. Specifically, the two paths of each BIPV module positioned in each of the four rows are independently connected in series. For example, a bus bar of BIPV module 902a is connected in series with a bus bar of BIPV module 902b, which in turn is connected in series with a bus bar of BIPV module 902c. In a similar manner, photovoltaic cells of BIPV module 902a are connected in series with photovoltaic cells of BIPV module 902b, which in turn are connected in series with photovoltaic cells of BIPV module 902c. Similar connections are provided in the three other rows.

BIPV modules 902a and 902j are considered the end modules in string 900, which means they are connected only to one other BIPV module. BIPV module 902a or, more specifically, its right connector, is only connected to BIPV module 902b. The left connector of BIPV module 902a is jumped, which means that its conductive elements are interconnected. The left connector of BIPV module 902a is jumped using a specially configured electrical routing structure 906. In certain embodiments, electrical routing structure 906 does not include any connectors. A jumper may be provided at the interface between BIPV module 902a and electrical routing structure 906. Electrical routing structure 906 may be used to fill the space between BIPV modules and/or other structures. Note that in certain alternate embodiments the left connector may be jumped using a conventional jumper connection. Alternatively, an electrical routing structure with two connectors, similar to electrical routing structures 904a, 904b, and 904c, may be used in the place of specially configured electrical routing structure 906. One of these connectors may be connected to the left connector of BIPV module 902a, while another connector may be connected to a jumper, which would effectively jump the left connector of BIPV module 902a. Another end module is BIPV module 902j, which is connected to only one other BIPV module, BIPV module 902k. Specifically, the right connector of BIPV module 902j is connected to BIPV module 902k. The left connector of BIPV module 902j is connected to a specially configured electrical routing stnrructure 908. Electrical routing structure 908 includes a feed-through 909 for feeding electrical wires through a building structure and, for example, to an inverter. This type of feed-through may also be referred to as an inverter drop.

Connections between BIPV modules in adjacent rows are provided by electrical routing structures 904a, 904b, and 904c. Specifically, electrical routing structure 904a interconnects BIPV modules 902c and 902f, while structure 904b interconnects BIPV modules 902i and 902l, and structure 904c interconnects BIPV modules 902d and 902g. Each electrical routing structure provides two separate connections between corresponding conductive elements of module connectors. As described above, one conductive element of each module connector is connected to the bus bar and may be referred to as a bus bar conductive element. Another conductive element of each module connector is connected to the photovoltaic cells of the module and may be referred to as a cell conductive element. In the example presented in FIG. 9, the bus bar conductive element of each module connector is depicted as the upper of the two conductive elements of the connector with the cell conductive element depicted as the lower of the two conductive elements.

A bus bar conductive element of the right connector of B IPV module 902c is connected to a cell conductive element of the right connector of BIPV module 902f using electrical routing structure 904a. The same electrical routing structure also interconnects a cell conductive element of the right connector of BIPV module 902c with a bus bar conductive element of the right connector of BIPV module 902f. Interconnecting a cell conductive element of one module with a bus bar conductive element of another module is referred to as a cross-over connection. A cross-over connection can be used when the cell conductive elements of the connected modules have the same polarity and an in-series connection (which connects cell conductive elements of different polarities) is employed. In the example of FIG. 9, BIPV modules 902c and 902f have the same polarity orientation in that their cell conductive elements of their right module connectors have the same polarity. The cross-over connection provided by electrical routing structure 904a, along with the return path provided by BIPV modules 902a, 902b, and 902c, and the jumping of the left module connector of BIPV module 902a effectively interconnects the cell conductive element of the left connector of module 902a and the cell conductive element of the right connector of module 902f. These cell conductive elements have different polarities. (By extension, the photovoltaic cells of modules 902a-902f are connected is series.) Electrical routing structures 904b and 904c also provide cross-over connections, structure 904b between end-of-row BIPV modules 902i and 902l and structure 904c between end-of-row BIPV modules. Other types of connections between two BIPV modules in adjacent rows are possible depending on the relative polarity orientation of BIPV modules in adjacent rows and desired interconnection schemes. For example, an electrical routing structure can provide a connection between cell conductive elements of two BIPV modules and/or a connection between bus bar conductive elements of two BIPV modules.

Electrical routing structure 904a is connected to the right connectors of BIPV modules 902c and 902f and electrical routing structure 904b is connected to right connectors BIPV modules 902i and 902l. Electrical routing structures 904a and 904b each have top and bottom connectors. The top connectors of these structures are offset to the right with respect to the bottom connectors. Since these connectors are positioned on the right end of the row, they are also offset out with respect to the center of these rows relative to the bottom connectors. As such, these electrical routing structures may be referred to as right up-and-out structures. Electrical routing structure 904c is connected to the left connectors of BIPV modules 902d and 902g. The top connector of this structure is offset to the left with respect to its bottom connector. Since this connector is positioned on the left end of the row, it is offset out with respect to the center of the rows relative to the bottom connector. As such, this electrical routing structure may be referred to as a left up-and-out structure. Other types of structures include left and right up-and-in structures. Structures may also vary based on their offset distance between their top and bottom connectors in the X direction. These variations and types of electrical routing structures are further described below with reference to FIGS. 12A-12E.

Figure 10A:
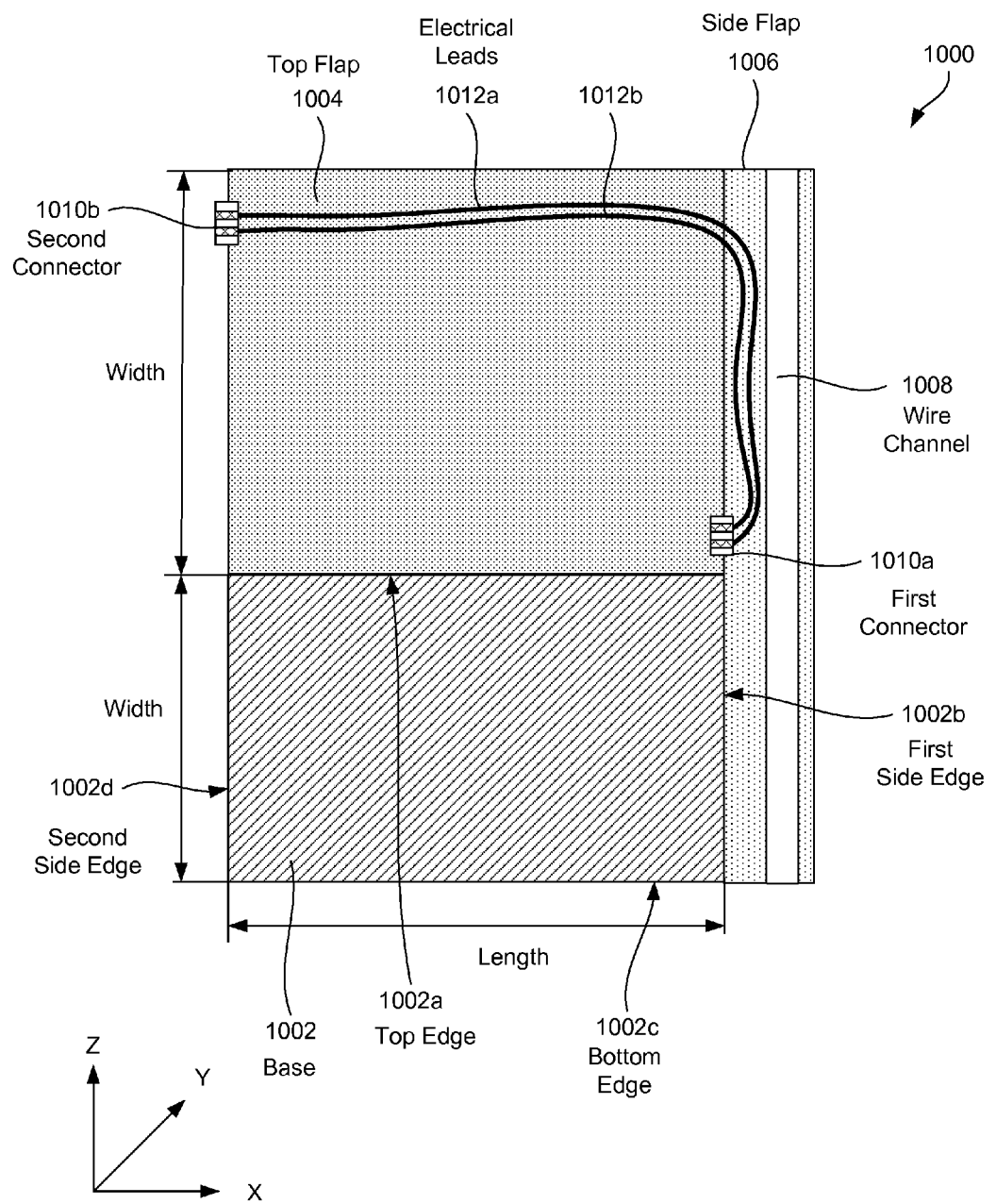
FIG. 10A is a schematic representation of an electrical routing structure, in accordance with certain embodiments.

FIG. 10A is a schematic illustration of an electrical routing structure 1000 having base 1002, top flap 1004, and side flap 1006, in accordance with certain embodiments. Base 1002 has four edges 1002a-1002d, i.e., top edge 1002a and bottom edge 1002c that define the width of base 1002, as well as side edges 1002b and 1002d that define its length. Side edges 1002b and 1002d may be substantially perpendicular to top and bottom edges 1002a and 1002c. In certain embodiments, the width of base 1002 is substantially the same as the width of the photovoltaic portions of BIPV modules. This width correspondence allows covering gaps between two adjacent rows of BIPV modules with the base of the electrical routing structure. During installation, base 1002 can be aligned with photovoltaic portions of BIPV modules positioned in the same row and can remain uncovered. The length of base 1002 may be substantially the same as the offset between BIPV modules in two adjacent rows. The electrical routing structure 1000 may be used to align the ends of the two adjacent rows by positioning it at the end of the shorter row. As such, after installation, right side edge 1002b is aligned with a right edge of a BIPV module positioned in the adjacent row. In certain embodiments, the length of base 1002 is about 50% or about 75% of the length of the corresponding BIPV module. In other embodiments, the length of base 1002 is less than 50% of the BIPV module length, for example about ⅓ of that length or even about 25%.

Top flap 1004 is attached to base 1002 at top edge 1002a of the base, for example, and these two components may be integrated into or part of the same body. In certain embodiments, the length of top flap 1004 substantially coincides with the length of base 1002 as shown in the example of FIG. 10A. The width of top flap 1004 may be substantially the same as the width of moisture flap portions of corresponding BIPV modules and may be greater than the width of base 1002. To provide moisture sealing, top flap 1004 can be extended during installation under the photovoltaic portion of a BIPV module positioned in an adjacent top row.

Top flap 1004 may be used fobr securing the electrical routing structure 1000 on the building structure. For example, top flap 1004 may include one or more mechanical fastener markers that indicate to an installer where mechanical fasteners should be drawn through top flap 1004. Some examples of mechanical fasteners include nails, screws, and staples. In certain embodiments, top flap 1004 includes one or more protrusions for accommodating protruding mechanical fasteners during installation of electrical routing structure 1000 on the building structure. Such protrusions may aid in preventing cracking or otherwise damaging top flap 1004 when the mechanical fasteners are drawn through top flap 1004 during installation.

Side flap 1006 is attached to base 1002 at first side edge 1002b and extends in the Z direction at least along the width of base 1002. Side flap 1006 may also extend in the same direction along the width of top flap 1004 and is typically attached to its side edge. In these embodiments, side flap 1006 extends in a continuous manner over the entire width of electrical routing structure 1000. This configuration of side flap 1006 allows it to form a moisture tight seal along the side edge 1002b with other building components, such as asphalt shingles. An overlap extending in the X direction is formed during installation of the array and other building components between side flaps of electrical routing structures and these other building components. Side flap 1006 may also overlap in the Z direction with other side flaps during installation of the photovoltaic array.

According to various embodiments side flap 1006 may be configured to extend under or over these other building components to form an overlap. For example, if side flap 1006 is configured to extend under building components, it may have a tapered thickness such that is less thick towards the right edge of side flap 1006 (as shown in FIG. 10A) than towards its left edge attached to base 1002 and top flap 1004. It has been found that BIPV modules and electrical routing structures positioned on building structures tend to operate at elevated temperatures because of little or no ventilation between the building structures and BIPV modules and/or electrical routing structures. If building components, such as asphalt shingles, are positioned under side flaps of electrical routing structures, then these elevated temperatures may cause premature degradation of the building components. However, if the same building components are positioned over the side flaps, some heat may dissipate from the building components and directly into the environment.

Side flap 1006 may include a wire channel 1008, which is sometimes referred to as a wire shroud. Wire channel 1008 may be used for housing wires that extend across the width of electrical routing structure 1000 (i.e., along the Z direction). These wires may deliver power from other photovoltaic strings in the array or include a vertical return path of the string that the electrical routing structure is a part of. Wire channel 1008 may include retaining features for supporting the wires in the channel during installation of the electrical routing structure and/or during its operation. In certain embodiments, an electrical routing structure is supplied with wires in wire channel 1008. These wires may be positioned into the channel during fabrication of the structure. In these embodiments, the electrical routing structure may also include corresponding connectors at the top and bottom ends of the wire channel for interconnecting with similar connectors of adjacent electrical routing structures to form continuous wires along the side of the array. Furthermore, in these embodiments, electrical routing structures may include switches for establishing and changing electrical connections between these wires, their end connectors, and connectors of the electrical routing structure.

Figure 10B:
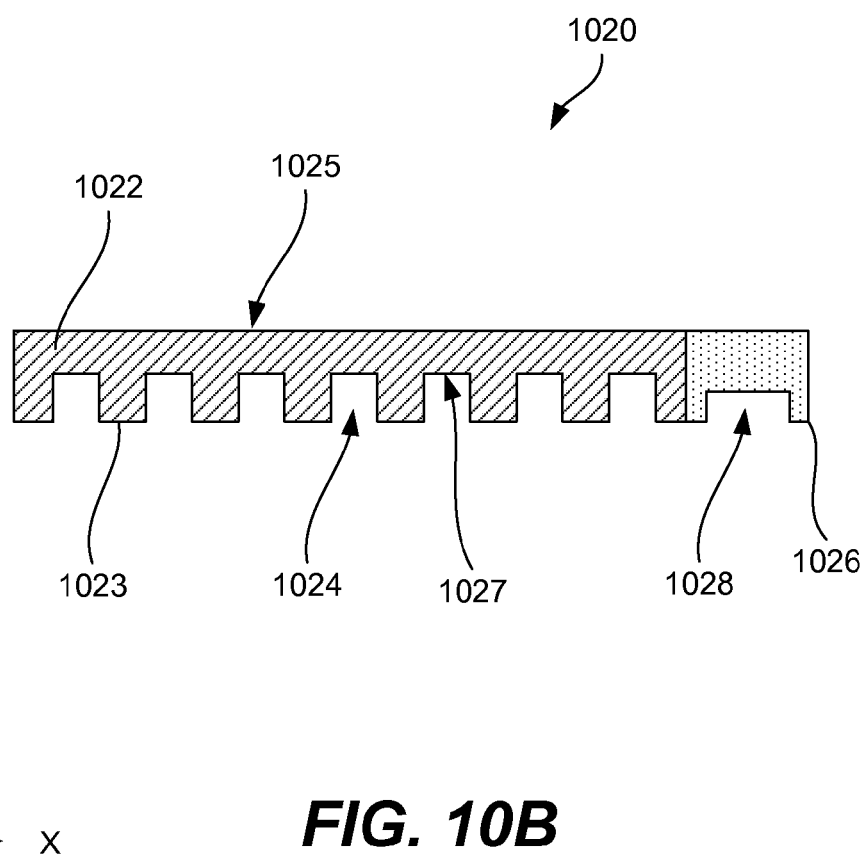
FIG. 10B is a schematic cross-sectional representation of an electrical routing structure, in accordance with certain embodiments.

In certain embodiments, an electrical routing structure includes two or more ribs attached to and protruding from the back side of the electrical routing structure as shown in FIG. 10B. Specifically, FIG. 10B is a schematic cross-section representation of an electrical routing structure 1020 having base 1022 and side flap 1026, in accordance with certain embodiments. Base 1022 includes multiple ribs 1023 attached to back side 1027 and extending away from front side 1025 of base 1022. These ribs 1023 form ventilation channels 1024 for ventilating back side 1027 of electrical routing structure 1020 when installed on the building structure. Ventilation channels 1024 may be positioned under base 1022 and, in certain embodiments, under the top flap (not shown in FIG. 10B or visible in this view). Ventilation channels may have variable depth along the width of the electrical routing structure (the Z direction). For example, the ventilation channels may be the deepest at the interface of the top flap and base and then taper down into the top flap and base. Side flap 1026 may also include a channel 1028 for ventilation and/or routing wires as explained elsewhere in this document. In other embodiments (not shown), a side flap does not have channels on its back side to minimize its thickness and reduce lifting, bending, and/or mechanical stress of the building components when positioned over the side flap after the installation.

Returning to FIG. 10A, electrical routing structure 1000 is shown to include two connectors, first connector 1010a and second connector 1010b. In certain embodiments, specially configured electrical routing structures including only one connector may be used. Such routing structures have been described above with reference to FIG. 9, i.e., specially configured electrical routing structures 906 and 908. In the example of FIG. 10A, each connector 1010a and 1010b may include two conductive elements for establishing electrical connections to respective conductive elements of BIPV modules.

First connector 1010a may be attached along first side edge 1002b of base 1002 and may be aligned with first side edge 1002b or be offset with respect to first side edge 1002b along the X direction (i.e., to the left or to the right with respect to the orientation of FIG. 10A). For example, first connector 1010a may be positioned within the boundaries of base 1002 or top flap 1004 (not shown). In another example, first connector 1010a may be extend between base 1002 and side flap 1006 (not shown) or between top flap 1004 and side flap 1006 (as shown in FIG. 10A). Being positioned along first side edge 1002b of base 1002 does not mean that first connector has to be supported by or even be in contact with base 1002. For example, FIG. 10A illustrates first connector 1010a being positioned at the interface of top flap 1004 and side flap 1006 and at a distance from base 1002.

Likewise, second connector 1010b may be attached along second side edge 1002d of base 1002 and may be aligned with second side edge 1002d or be offset with respect to second side edge 1002d along the X direction. For example, second connector 1010b may be positioned within the boundaries of base 1002 or top flap 1004 (not shown). In another example, second connector 1010b may extend outside base 1002 (not shown) or outside top flap 1004 (as shown in FIG. 10A). Again, being positioned along second side edge 1002d of base 1002 does not mean that second connector 1010b has to be supported by or even be in contact with base 1002. As shown in FIG. 10A, second connector 1010b is supported by top flap 1004 and positioned at a distance from base 1002. In general, position of first and second connectors 1010a and 1010b will depend on position the respective module connectors.

One or both connectors may be flexibly attached to an electrical routing structure and move in the Z direction and/or X direction with respect to the electrical routing structure. This flexibility allows making electrical connections to two module connectors of the BIPV modules, when these BIPV modules are not perfectly aligned. Furthermore, this flexibility allows to maintain electrical connections and to overcome thermal expansion differences during operation of the photovoltaic array. In certain embodiments, one connector is movable with respect to another connector. This motion may be achieved by flexible attachment of one or both connectors with respect to the electrical routing structure and/or flexibility of the electrical routing structure itself.

Conductive elements of first connector 1010a and second connector 1010b may be shaped as a cylinder or some other elongated shape that extends along its axis. In certain embodiments, this axis may be substantially parallel to a back side of the base, while in other embodiments, it may be substantially perpendicular to a back side of the base. Depending on the particular orientation of this axis, different movements of the electrical routing structure with respect to BIPV modules can be made to make electrical connections.

Each one of the two conductive elements of first connector 1010a and second connector 1010b is electrically connected to a corresponding conductive element of another connector. Specifically, electrical routing structure 1000 also includes two electrical leads 1012a and 10121b such that each lead interconnects one conductive element of first connector 1010a with a corresponding conductive element of second connector 1010b. Electrical lead 1012a interconnects the bottom conductive element of first connector 1010a and the top conductive element of second connector 1010b, while electrical lead 1012b interconnects the top conductive element of first connector 1010a and the bottom conductive element of second connector 1010b. In other embodiments, each connector may have one, three, or more conductive elements and a corresponding number of electrical leads interconnecting the conductive elements of the two connectors. When a specially configured structure includes only one connector (e.g., specially configured electrical routing structures 906 and 908 illustrated in FIG. 9), then no electrical leads may be provided in this structure. In certain embodiments, an electrical routing structure includes one or more photovoltaic cells. In these embodiments, electrical leads may be connected to electrical terminals of the photovoltaic cell in addition to the connectors of the electrical routing structure. These embodiments are further described below with reference to FIG. 13A.

Electrical leads 1012a and 1012b may be routed through various portions of electrical routing structure 1000. FIG. 10A illustrates electrical leads 1012a and 1012b routed through top flap 1004 and side flap 1006. In other embodiments, electrical leads 1012a and 1012b may be routed through base 1002. Furthermore, side flap 1006 may be used for routing the electrical leads. Some of these examples are schematically illustrated in FIGS. 12B-12E and further described below.

In certain embodiments, an electrical routing structure includes a wire conduit that is attached to the back side of the structure and extends from this side, for example, in a direction substantially direction to the plane of the structure. During installation, the wire conduit protrudes through the installation surface of the building structure, for example, roofing boards and may be used to route wire from the electrical routing structure to the inside of the building structure. These wires may be then connected to an inverter or some other electrical component of the array. As such, the wire conduit is sometimes referred to as an inverter drop. In certain embodiments, the wire conduit is attached to the back side of the side flap. In specific embodiments, the wire conduit is aligned with the wire channel such that the wires from the wire channel may be fed into the wire conduit.

Figure 11:
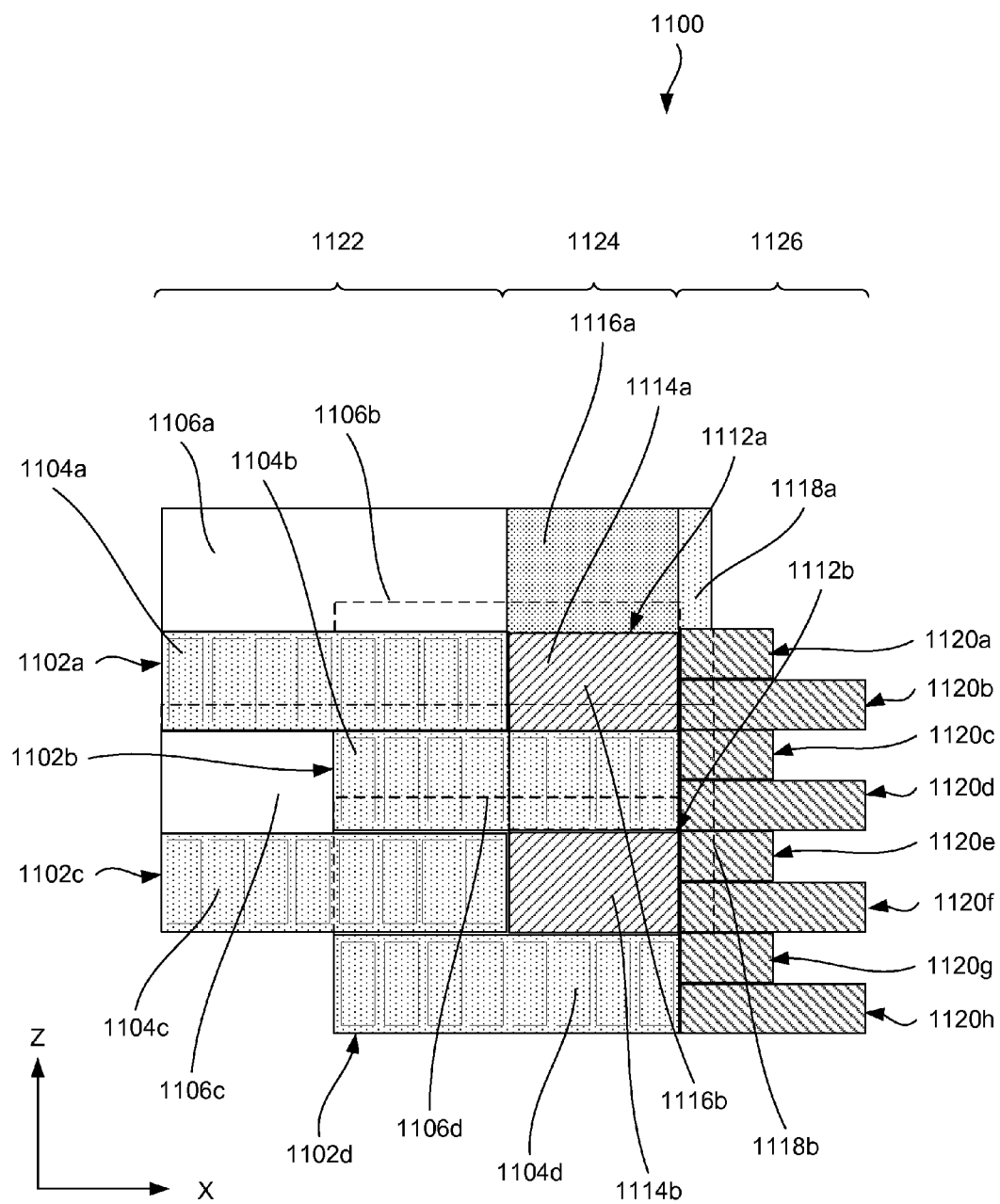
FIG. 11 is a schematic top view of a photovoltaic array portion that includes four BIPV modules and two electrical routing structures interfacing with these BIPV modules and asphalt shingles.

The electrical routing structures described herein may be configured to seal interfaces with BIPV modules, building components, and adjacent electrical routing structures. FIG. 11 is a schematic representation a photovoltaic array portion 1100 that includes four BIPV modules 1102a-1102d and two electrical routing structures 1112a and 1112b interfacing with asphalt shingles 1120a-1120h, in accordance with certain embodiments. This arrangement can be conceptually divided along the X direction into BIPV part 1122 that includes only BIPV modules, a transition part 1124 that includes both BIPV modules and electrical routing structures, and a shingle part 1126 that includes the asphalt shingles and side flaps of the electrical routing structures. Sealing with each of these three parts and two interfaces among these three parts will now be described.

BIPV modules 1102a-1102d are shown to include their photovoltaic portions and flap portions. Specifically, module 1102a has photovoltaic portion 1104a and flap portion 1106a, module 1102b has photovoltaic portion 1104b and flap portion 1106b (shown with dashed lines), module 1102c has photovoltaic portion 1104c and flap portion 1106c, and module 1102d has photovoltaic portion 1104d and flap portion 1106d (also shown with dashed lines). Sealing within this BIPV part 1122 is achieved by overlapping photovoltaic portions and flap portions. Specifically, flap portion 1106d extends under photovoltaic portion 1104c effectively sealing the interface between photovoltaic portion 1104c and photovoltaic portion 1104d. A part of flap portion 1106d may also extend under photovoltaic portion 1104b and flap portion 1106c as shown in FIG. 11. Similar sealing is provided between BIPV modules 11102c and 1102b and between BIPV modules 1102b and 1102a.

Continuing with transition part 1124, electrical routing structures 1112a and 1112b each include their bases, top flaps, and side flaps. Specifically, electrical routing structure 1112a includes base 1114a, top flap 1116a, and side flap 1118a, while electrical routing structure 1112b includes base 1114b, top flap 1116b, and side flap 1118b. As with other components, the portions of top flap 1116b and side flap 1118b hidden by other components are shown with dashed lines. Transition part 1124 also includes parts of BIPV modules 1102d and 1102b. These modules are offset to the right (i.e., the X direction) with respect to BIPV modules 1102c and 1102a. This offset result in uncovered spaces between photovoltaic portions 1104d and 1104b and above photovoltaic portion 1104b. While these gaps are covered by moisture flaps 1106d and 1106b, these flaps alone may not be sufficient for proper sealing. For example, the overlap between flap portion 1106d and photovoltaic portion 1104b in transition part 1124 is small relative to the overlaps between flap portions and photovoltaic portions within BIPV part 1122.

To provide adequate sealing in transition part 1124, electrical routing structures 1112a and 1112b are positioned in this part. Specifically, base 1114b of electrical routing structure 1112b is positioned in the gap between photovoltaic portions 1104b and 1104d and to the right of photovoltaic portion 1104c. A combination of the base 1114b and top flap 1116b of this electrical routing structure provides sufficient overlap with flap portion 1106d of BIPV module 1102d. Top flap 1116b also overlaps with photovoltaic portion 1104b and flap portion 1106b of BIPV module 1102b and with base 1114a of electrical routing structure 1112a. As such, electrical routing structures 1112a and 1112b in transition part 1124 provides sealing similar to BIPV part 1122. The interface between BIPV part 1122 and transition part 1124 is sealed by flap portions 1106d and 1106b that extend under interfaces between photovoltaic portion 1104c and base 1114b and between photovoltaic portion 1104a and base 1114a.

Continuing with shingle part 1126, FIG. 11 illustrates asphalt shingles 1120a-1120h but does not show their moisture flaps for clarity and visibility of other components in this figure. One having ordinary skill in the art would understand the sealing features of asphalt shingles 1120a-1120h that may be similar to these of BIPV modules 1102a-1102d. The interface between transition part 1124 and asphalt shingle part 1126 is sealed by side flaps 1118a and 1118b of electrical routing structures 1112a and 1112b. Specifically, side flap 1118b is attached and sealed with respect to base 1114b and top flap 1116b. Side flap 1118b extends under shingles 1120c-1120f and a portion of shingle 1120b. Side flap 1118b also overlaps with side flap 1118a of electrical routing structure 1112a, which extends under shingles 1120a and 1120b.

The areas of building structures available for installation of photovoltaic arrays often have irregular shapes, obstacles, and variable dimensions. These issues complicate arrangement and interconnection of BIPV modules in the arrays. At the same time, it is desirable to position as many BIPV modules as possible in available areas in order to maximize the electrical power output of the resulting array. Often this results in different relative positions of the ends of two adjacent rows. In certain situations, the end of the top row may extend past the corresponding end of the adjacent bottom row with respect to the center of the rows, while in other situations the end of the bottom row may extend past the corresponding end of the adjacent top row. This inconsistency may appear both for right ends of the rows and/or left ends. Electrical routing structures may be configured to interconnect such ends, which will now be described in more detail with reference to FIGS. 12A-12E.

Figure 12A:
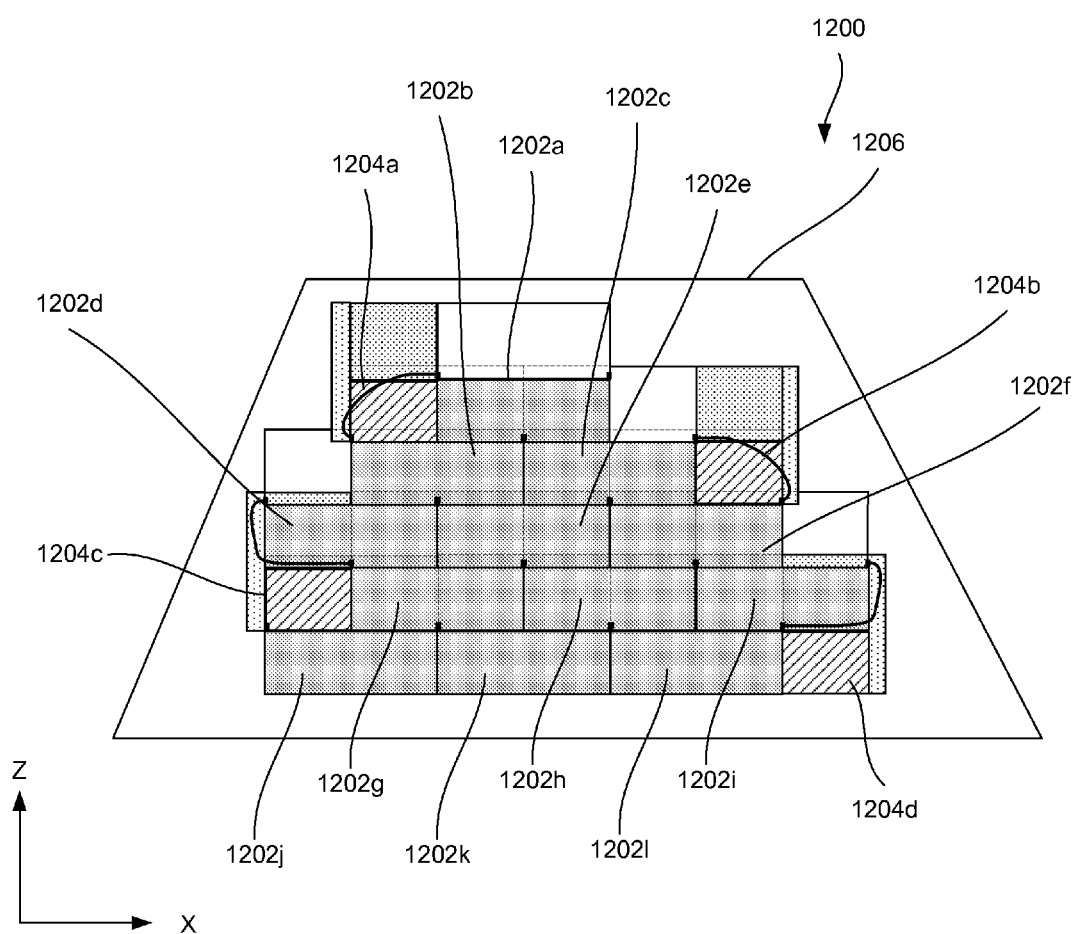
FIG. 12A is a schematic representation of a photovoltaic string including twelve BIPV modules covering a portion of a tapered installation area on the building structure and interconnected with different types of electrical routing structures, in accordance with certain embodiments.

FIG. 12A illustrates a photovoltaic string 1200 that includes twelve BIPV modules 1202a-1202l arranged within a tapered installation area 1206 and interconnected with four electrical routing structures 1204a-1204d, in accordance with certain embodiments. Tapered installation area 1206 is wider (in the X direction) at the bottom than at the top and, therefore, can generally accommodate more BIPV modules in the lower rows of the string. Overall, there are five rows in this photovoltaic string 1200. BIPV modules in adjacent rows are offset with respect to each other to provide moisture sealing characteristics and a pleasing aesthetic appearance to string 1200. Other structures, such as asphalt shingles, are not shown for clarity. Modules 1202a and 1202j are the end modules of this string. One of these modules may have a jumper attached to it, while another module may have its conductive elements attached to an inverter. Additional description of end modules is provided above with reference to FIG. 9. The module connectors are shown with black rectangles and are positioned in moisture flap portions of BIPV modules 1202a-1202l. During installation these connectors are covered by other components, such as photovoltaic portions of BIPV modules in adjacent rows. Adjacent connectors of two adjacent BIPV modules in the same row are interconnected, for example, using joiner connectors. Some connectors of BIPV modules in adjacent rows are interconnected using electrical routing structures 1204a-1204d as further described below.

BIPV modules 1202a-1202l are arranged within tapered installation area 1206 in a way that maximizes the coverage of the installation area with these modules without modules or electrical routing structures extending past the boundaries of the installation area. Specifically, the top row has only one BIPV module 1202a and one electrical routing structure 1204a that interconnects module 1202a with module 1202b in the second row. Since the left edge of module 1202a is offset towards the center of the row (i.e., in the X direction) with respect to the left edge of module 1202b, electrical routing structure 1204a may be referred to as a left up-and-in structure.

Arrangement of the components in left up-and-in electrical routing structures will now be described with reference to FIG. 12B. Specifically, FIG. 12B is a schematic representation of left up-and-in electrical routing structure 1204a, in accordance with certain embodiments. In this top view of structure 1204a, side flap 1212a is positioned to the left of base 1214a, Right connector 1216a of this structure is positioned above its left connector 1218a. The vertical orientation of the connectors with respect to other components of structure 1204a can be determined by locations of module connectors in the corresponding modules. For example, if module connectors of BIPV modules are positioned in their moisture flap areas (which is not specifically shown in FIG. 12A), then right connector 1216a may be positioned in top flap 1213a, while left connector may be positioned at the interface of side flap 1212a and base 1214a. However, other vertical positions of module connectors and, as a result, structure connectors are possible. For example, a module connector may be positioned at the interface of the photovoltaic and flap portion of the module. In these embodiments, one structure connector (e.g., the right connector of the left up-and-in electrical routing structure) can be positioned at the interface of the base and top flap. The other structure connector (e.g., the left connector of the left up-and-in electrical routing structure) cane be positioned at the bottom edge of the base, for example, at the interface of the base and side flap.

Returning to FIG. 12A, in addition to BIPV module 1202b, the second row also includes BIPV module 1202c. Only two BIPV modules and one electrical routing structure may be accommodated in this row without going outside of the boundaries of the installation area 1206. BIPV module 1202c is connected to module 1202b and to BIPV module 1202f in the third row. The connection between BIPV modules 1202c and 1202f is provided by electrical routing structure 1204b. This structure may be referred to as a right up-and-in structure because the right edge of module 1202c is offset towards the center of the row (i.e., in this case opposite to the X direction) with respect to the right edge of module 1202f. FIG. 12C is a schematic top view of right up-and-in electrical routing structure 1204b, in accordance with certain embodiments. In this view, side flap 1212b of the structure is positioned to the right of base 1214b. Right connector 1216b of structure 1204b is positioned below its left connector 1218b. For example, right connector 1216b may be positioned at the interface of side flap 1212b and base 1214b, while left connector 1218b may be positioned in top flap 1213b. Other positions of connectors 1216b and 1218l) are possible and generally determined by positions of module connectors. One example of the right up-and-in electrical routing structure is described above with reference to FIG. 10A. Right up-and-in electrical routing structures and left up-and-in electrical routing structures may be mirror images of each other with respect to the center line of their respective rows.

Returning to FIG. 12A, the third row includes three interconnected BIPV modules 1202d-1202f. As described above, BIPV module 1202f is connected to module 1202c in the second row. BIPV module 1202d is connected to module 1202g in the fourth row by electrical routing structure 1204c. In this situation, the left edge of module 1202d is offset away from the center of the row (i.e., opposite to the X direction) with respect to the left edge of module 1202g. That is the top row extends past the bottom row. As a result, electrical routing structure 1204c may be referred to as a left up-and-out structure. Up-and-out structures 1204c and 1204d may differ from up-and-in structures 1204a and 1204b in various ways. First, up-and-out structures 1204c and 1204d interconnect top and bottom rows where ends of the bottom rows extend past ends of the top rows, whereas up-and-in structures 1204a and 1204b interconnect top and bottom rows where ends of the top rows extend past ends of the bottom rows. Connectors of up-and-out structures 1204c and 1204d may be shifted upwards with respect to their bases in comparison to position of the same connectors in up-and-in structures 1204a and 1204b as shown in FIGS. 12B-12E.

Specifically, FIG. 121) is a schematic top view of left up-and-out structure 1204c, in accordance with certain embodiments. In this view, side flap 1212c of this structure is positioned to the left of base 1214c. Right connector 1216c of this structure is positioned below its left connector 1218c. For example, right connector 1216c may be positioned in top flap 1213c while left connector may be positioned at the interface of side flap 1212c and top flap 1213c. FIG. 12E is a schematic top view of right up-and-out structure 1204d, in accordance with certain embodiments. In this view, side flap 1212d of this structure is positioned to the right of base 1214d. Right connector 1216d of this structure is positioned above its left connector 1218d. For example, right connector 1216d may be positioned at the interface of top flap 1213d and side flap 121d, while left connector 1218d may be positioned in top flap 1213d. Other positions of connectors in these structures are possible and generally determined by positions of module connectors. Right up-and-out structure 1204d interconnects modules 1202i and 1202l, where the right edge of module 1202i is offset away from the center of the row (i.e., opposite to the X direction) with respect to the right edge of module 1202l.

As explained above, after installation of an electrical routing structure, the front side of its base is exposed to the environment and in particular to sunlight. The appearance of this front side may be such that it matches the appearance of the photovoltaic portion of adjacent BIPV modules. However, the electrical routing structure in some of these embodiments may not include any photovoltaic cells. In other embodiments, an electrical routing structure includes one or more photovoltaic cells, which are used for generating additional electrical power added to the overall power output of the string. A portion of the electrical routing structure containing photovoltaic cells is referred to as a photovoltaic portion. The photovoltaic cells may be positioned on the front side of a base portion. In the same or other embodiments, photovoltaic cells may be positioned on a portion of the side flap that does not extend under the other building components. In these embodiments, the side flap has two portions: an exposed portion supporting one or more photovoltaic cells and covered portion forming an overlap with other building components.

Photovoltaic cells positioned in a photovoltaic portion of the electrical routing structure may be interconnected in a manner similar to the cells in corresponding BIPV modules. For example, these cells may be interconnected in series, in parallel, or according to various combinations of these interconnection schemes. In certain embodiments, a photovoltaic portion has the same voltage rating as corresponding BIPV modules. In the same or other embodiments, an electrical routing structure may have smaller photovoltaic cells, but the number of these cells include in its photovoltaic portion is the same as the number of cells in BIPV module. Alternatively, the photovoltaic cells in both BIPV modules and electrical routing structures may have substantially the same size to achieve the same current ratings.

Figure 13A:
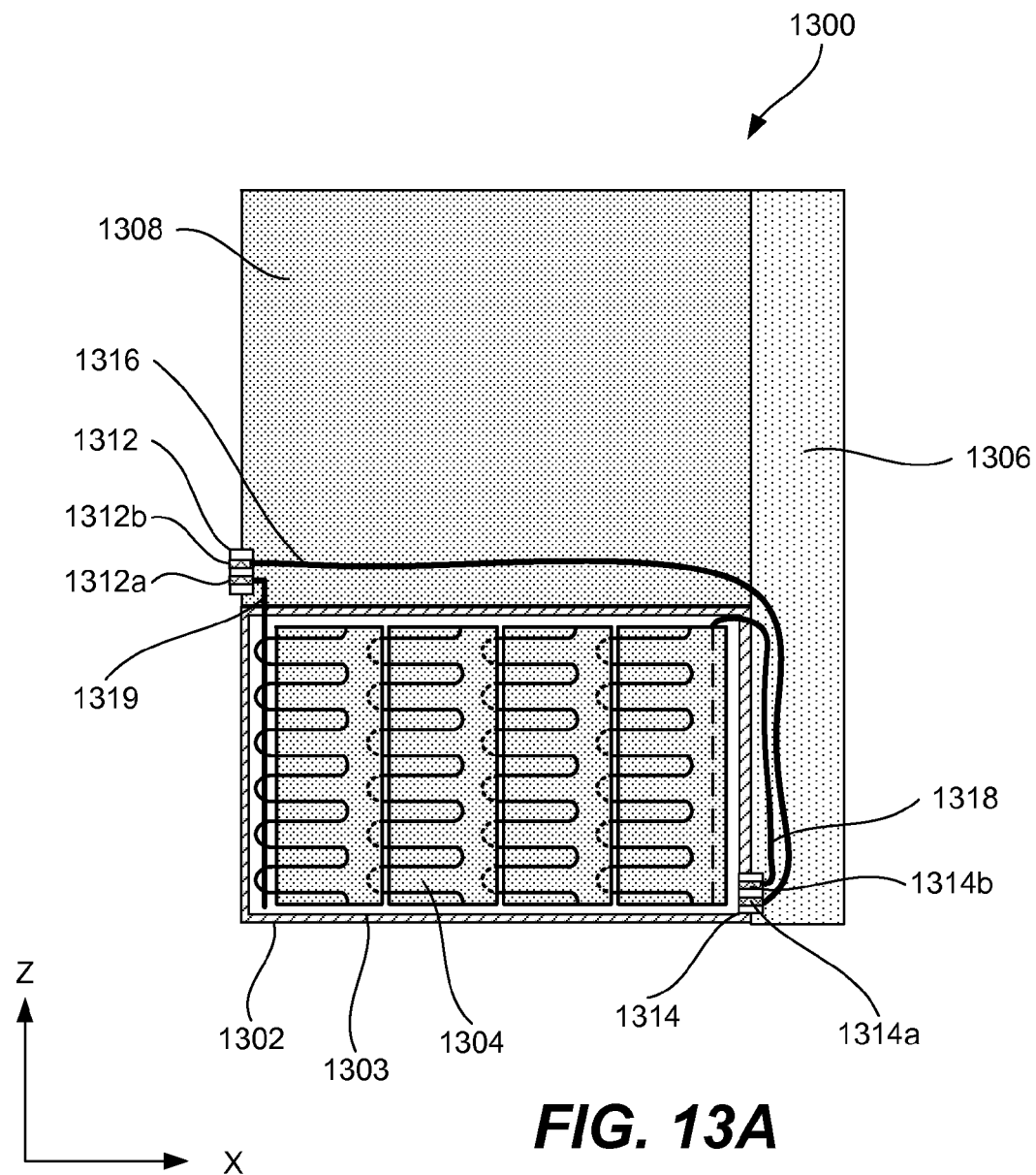
FIG. 13A is a schematic top view of an electrical routing structure having photovoltaic cells in a photovoltaic portion, in accordance with certain embodiments.

Interconnected photovoltaic cells in the photovoltaic portion of an electrical routing structure may have two electrical leads. These leads may be connected to conductive elements of the two connectors of the structure in accordance with various embodiments. One such embodiments is shown in FIG. 13A. Specifically, FIG. 13A is a schematic representation of an electrical routing stnructure 1300 having photovoltaic cells 1304 arranged within a photovoltaic portion 1303, in accordance with certain embodiments. Photovoltaic portion 1303 is positioned on a front side of a base 1302. Electrical routing structure 1300 also includes a top flap 1308 and side flap 1306.

Photovoltaic cells 1304 are interconnected within photovoltaic portion 1303 and have two electrical leads 1318 and 1319 extending from photovoltaic portion 1303. Electrical leads 1318 and 1319 have two different polarities; electrical lead 1318 is connected to the back side of the rightmost photovoltaic cell, while electrical lead 1319 is connected to the leftmost photovoltaic cell. Electrical lead 1318 is connected to bottom conductive elements 1314a of right connector 1314. Electrical lead 1319 is connected to bottom conductive elements 1312a of left connector 1312. Therefore, photovoltaic cells are connected in series with leads 1319 and 1318. Top conductive elements 1312b and 1314b of these two connectors are interconnected with electrical lead 1316.

Figure 13B:
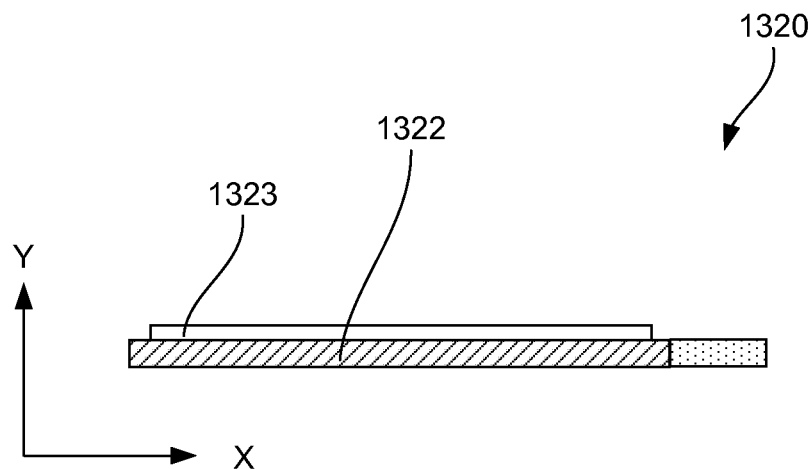
FIG. 13B is a schematic side view of an electrical routing structure that has a photovoltaic portion positioned adjacent to the top of the base sheet, in accordance with certain embodiments.
Figure 13C:
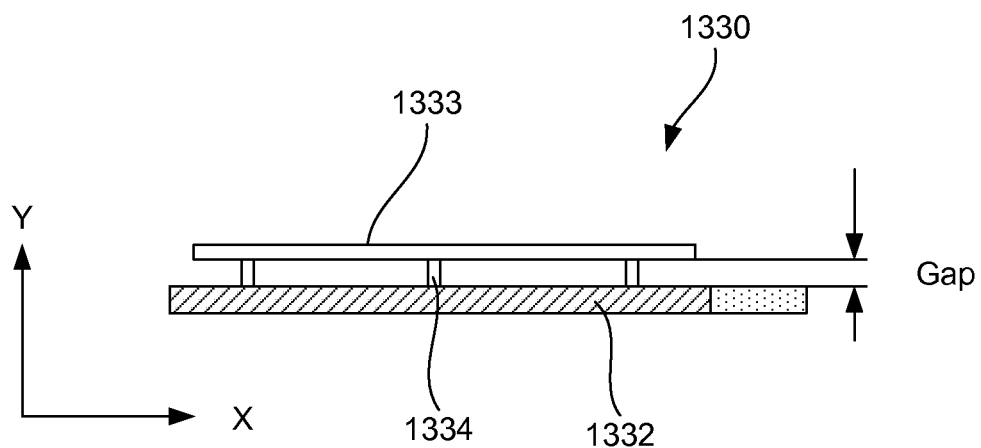
FIG. 13C is a schematic side view of another electrical routing structure that has a gap between the photovoltaic portion and base sheet, in accordance with certain embodiments.

In certain embodiments, photovoltaic cells are sealed between two sealing sheets that form a photovoltaic portion. The bottom sealing sheet may be in contact with the top surface of base and/or side flap. One such example is shown in FIG. 13B, where an electrical routing structure 1320 has photovoltaic portion 1323 is that in direct contact with base 1322. There is no gap between photovoltaic portion 1323 and base 1322 in this example. In certain embodiments, a base is as a back sealing sheet and photovoltaic cells are positioned directly on the base during fabrication of the electrical routing structure. In other examples, a photovoltaic portion has a separate sealing sheet that is later attached to the base. In other embodiments, a photovoltaic portion is separated from the base such that there is a gap between the photovoltaic portion and base. One such example is shown in FIG. 13C, where an electrical routing structure 1330 has photovoltaic portion 1333 positioned on spacers 1334 and above base 1332. In this example, there is a gap between photovoltaic portion 1333 and base 1332. This gap may be used for ventilation of electrical routing structure 1330 and cooling down its component. It has been found that lower operating temperature may help to improve efficiencies of photovoltaic cells. Furthermore, the gap may be used for draining water in between photovoltaic portion 1333 and base 1332.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. An electrical routing structure for installing on a building structure and interconnecting two adjacent rows of building integrable photovoltaic modules, the electrical routing structure comprising:
   a base comprising a top edge and a bottom edge defining the width of the base, the width of the base substantially the same as the width of photovoltaic portions of the building integrable photovoltaic modules, the base further comprising a first side edge and a second side edge defining the length of the base;
   a top flap attached to the base at the top edge of the base such that the length of the top flap substantially coincides with the length of the base, the width of the top flap substantially the same as the width of moisture flap portions of the building integrable photovoltaic modules and greater than the width of the base, the top flap being configured to extend at least under a photovoltaic portion of one building integrable photovoltaic module positioned in a row above the two adjacent rows;
   a side flap attached to the base at the first side edge and extending along the width of the base and the width of the top flap, the side flap being configured to extend under sealing components of the building structure;
   a first connector comprising at least two conductive elements and positioned along the first side edge;
   a second connector comprising at least two conductive elements positioned along the second side edge; and
   at least two electrical leads each connecting one conductive element of the first connector with a corresponding conductive element of the second connector.

2. The electrical routing structure of claim 1, further comprising a wire channel provided in the side flap and extending along the width of the base and the width of the top flap, the wire channel is configured to route wires extending from adjacent electrical routing structures.

3. The electrical routing structure of claim 1, further comprising a wire conduit attached to a back side of the side flap and protruding substantially perpendicular to the back side.

4. The electrical routing structure of claim 1, wherein the base comprising one or more photovoltaic cells provided on a light incident side of the base.

5. The electrical routing structure of claim 4, wherein the one or more photovoltaic cells are connected in series with one of the electrical leads.

6. The electrical routing structure of claim 4, wherein a voltage output rating of the one or more photovoltaic cells is substantially the same as for the building integrable photovoltaic modules.

7. The electrical routing structure of claim 4, wherein a size of each of the one or more photovoltaic cells is substantially the same as photovoltaic cells in the building integrable photovoltaic modules.

8. The electrical routing structure of claim 4, wherein a portion of the side flap adjacent to the base is configured to be exposed to the light and comprises additional one or more photovoltaic cells.

9. The electrical routing structure of claim 4, wherein the one or more photovoltaic cells are sealed between two sealing sheets forming a photovoltaic portion, the photovoltaic portion positioned above the base with a gap between the base and the photovoltaic portion.

10. The electrical routing structure of claim 1, wherein a light incident side of the base matches in appearance a front side of the photovoltaic portion of the building integrable photovoltaic modules.

11. The electrical routing structure of claim 1, wherein a back side of the base comprises two or more ribs to form channels for ventilating the back side of the electrical routing structure when installed on the building structure.

12. The electrical routing structure of claim 1, wherein the top flap includes one or more mechanical fasteners' markers.

13. The electrical routing structure of claim 1, wherein the top flap includes one or more protrusions for protruding mechanical fasteners during installation of the electrical routing structure on the building structure.

14. The electrical routing structure of claim 1, wherein a back side of the base is shifted upward with respect to a back side of the side flap for accommodating a moisture flap portion of a building integrable photovoltaic module connected to the first connector.

15. The electrical routing structure of claim 1, wherein the first connector is flexibly attached to the base.

16. The electrical routing structure of claim 1, wherein the first connector is movable with respect to the second connector.

17. The electrical routing structure of claim 1, wherein the conductive elements of the first connector have cylindrical shapes substantially parallel to a back side of the base.

18. The electrical routing structure of claim 1, wherein the conductive elements of the first connector have cylindrical shapes substantially perpendicular to a back side of the base.

19. The electrical routing structure of claim 1, wherein the first connector is positioned within boundaries of the base.

20. The electrical routing structure of claim 1, wherein the second connector is positioned within boundaries of the top flap.

* * * * *